(12) United States Patent
Tremblay et al.

(10) Patent No.: US 8,269,503 B2
(45) Date of Patent: Sep. 18, 2012

(54) ELECTRICAL NETWORK FAULT LOCATION BY DISTRIBUTED VOLTAGE MEASUREMENTS

(75) Inventors: Mario Tremblay, Varennes (CA); Ryszard Pater, Saint-Laurent (CA); Francisc Zavoda, Montréal (CA); Mario Germain, Saint-Roch-de-Richelieu (CA)

(73) Assignee: Hydro-Quebec, Montreal, Quebec (CA)

( * ) Notice: Subject to any disclaimer, the term of this patent is extended or adjusted under 35 U.S.C. 154(b) by 425 days.

(21) Appl. No.: 12/450,667

(22) PCT Filed: Apr. 16, 2008

(86) PCT No.: PCT/CA2008/000691
§ 371 (c)(1),
(2), (4) Date: Oct. 5, 2009

(87) PCT Pub. No.: WO2008/128324
PCT Pub. Date: Oct. 30, 2008

(65) Prior Publication Data
US 2010/0102824 A1    Apr. 29, 2010

(30) Foreign Application Priority Data

Apr. 18, 2007 (CA) .................................... 2585820

(51) Int. Cl.
*G01R 31/08* (2006.01)
(52) U.S. Cl. ........................................ 324/522; 324/512
(58) Field of Classification Search ............. 324/522
See application file for complete search history.

(56) References Cited

U.S. PATENT DOCUMENTS

| 4,800,509 A | 1/1989 | Nimmersjö |
| 4,871,971 A | 10/1989 | Jeerings et al. |
| 4,906,937 A * | 3/1990 | Wikstrom et al. ............ 324/522 |
| 5,202,812 A | 4/1993 | Shinoda et al. |
| 5,485,093 A | 1/1996 | Russell et al. |

(Continued)

FOREIGN PATENT DOCUMENTS

CA    2295342 A1    7/2000

OTHER PUBLICATIONS

Girgis et al., A new fault location technique for two- and three-terminal lines, Trans. Power Delivery, V. 7, No. 1, Jan. 1992, p. 98-107.*

(Continued)

*Primary Examiner* — Thomas Valone
(74) *Attorney, Agent, or Firm* — Muirhead and Saturnelli, LLC

(57) ABSTRACT

A method of locating a fault on an electrical network energized by a source uses a form of triangulation of voltage measurements at at least three different locations on the network, with at least one of the locations situated upstream from the fault with respect to the source. Voltage phasors corresponding to the voltages measured during the fault are time synchronized. Conductors of the network involved in the fault are determined as a function of characteristics of the voltage phasors and a fault current causing a voltage drop at one of the locations with respect to an initial voltage value is evaluated. A position of the fault is evaluated at a point of the network where a ratio between a difference of the voltages measured at two of the locations and an impedance between one of the two locations and the point is equal to the fault current.

21 Claims, 8 Drawing Sheets

U.S. PATENT DOCUMENTS

| | | | | |
|---|---|---|---|---|
| 5,506,789 | A | 4/1996 | Russell et al. | |
| 5,659,242 | A | 8/1997 | Calero | |
| 5,724,247 | A | 3/1998 | Dalstein | |
| 5,764,044 | A | 6/1998 | Calero | |
| 5,764,064 | A * | 6/1998 | Eriksson et al. | 324/509 |
| 5,839,093 | A | 11/1998 | Novosel et al. | |
| 5,966,675 | A | 10/1999 | Koeck | |
| 6,256,592 | B1 | 7/2001 | Roberts et al. | |
| 6,420,876 | B1 | 7/2002 | Saha et al. | |
| 6,476,613 | B2 | 11/2002 | Saha et al. | |
| 6,477,475 | B1 | 11/2002 | Takaoka et al. | |
| 6,525,543 | B1 | 2/2003 | Roberts et al. | |
| 6,584,417 | B1 | 6/2003 | Hu et al. | |
| 6,591,203 | B1 | 7/2003 | Das et al. | |
| 6,597,180 | B1 | 7/2003 | Takaoka et al. | |
| 6,601,001 | B1 | 7/2003 | Moore | |
| 6,690,175 | B2 | 2/2004 | Pinzon et al. | |
| 6,694,270 | B2 | 2/2004 | Hart | |
| 6,721,671 | B2 | 4/2004 | Roberts | |
| 7,472,026 | B2 * | 12/2008 | Premerlani et al. | 702/59 |
| 2002/0121903 | A1 | 9/2002 | Hu et al. | |
| 2002/0149375 | A1 | 10/2002 | Hu et al. | |
| 2004/0032265 | A1 | 2/2004 | Turner | |
| 2007/0156358 | A1 | 7/2007 | Saha et al. | |
| 2008/0284447 | A1 * | 11/2008 | Wahlroos et al. | 324/522 |

OTHER PUBLICATIONS

IEEE Std C37.114-2004, "IEEE Guide for Determining Fault Location on AC Transmission and Distribution Lines," IEEE Power Engineering Society, Jun. 8, 2005, 44 pp.

* cited by examiner

ELECTRICAL NETWORK FAULT LOCATION BY DISTRIBUTED VOLTAGE MEASUREMENTS

FIELD OF THE INVENTION

The invention relates to a method of fault location on an electrical network by distributed voltage measurements. The method allows in particular the location of permanent and fugitive faults on power distribution and transmission networks in service.

BACKGROUND

Different examples of analysis techniques based on the phase of voltage signals coming from measurements taken on an electrical network, in particular for network monitoring purposes, are shown in US patent application Nos. 2004/0032265 (Turner); 2002/0149375 (Hu et al.); 2002/0121903 (Hu et al.); and U.S. Pat. Nos. 6,694,270 (Hart); 6,690,175 (Pinzon et al.); 6,584,417 (Hu et al.); 6,721,671 (Roberts); 6,601,001 (Moore); 5,966,675 (Koeck); 5,839,093 (Novosel et al.); 5,764,044 (Calero); 5,724,247 (Dalstein); 5,659,242 (Calero); 5,506,789 (Russell et al.); 4,871,971 (Jeerings et al.); and 4,800,509 (Nimmersjo).

Examples of techniques proposed to locate faults on an electrical network are shown in U.S. Pat. Nos. 6,420,876 (Saha et al.); 6,256,592 (Roberts et al.); 5,485,093 (Russell et al.); 6,525,543 (Roberts et al.); 6,477,475 (Takaoka et al.); 6,597,180 (Takaoka et al.); 6,591,203 (Das et al.); and 6,476,613 (Saha et al.).

Despite all these techniques, there is still that the location of faults on electrical networks and more particularly distribution ones, is limited by many unknown parameters like the fault impedance, the complexity of the network, the load imbalance and the difficulty to build an appropriate network model. All this and other troublesome factors or elements harden the application of these techniques which, moreover, may prove to be unreliable or inaccurate.

These in-service fault location techniques indicate the distance of the fault, leaving way to an important number of possible positions for location of the fault on the electrical network.

SUMMARY

An object of the present invention is to provide a method of fault location on an electrical network in service which is practicable with a limited number of measurements.

Another object of the present invention is to propose such a locating method which, in addition to the fault position, allows obtaining the fault current and the voltage developed at the fault location.

Another object of the present invention is to provide such a locating method which is much less dependent from parameters such as the fault impedance, the complexity of the network, the load imbalance and the difficulty to build an appropriate network model.

Another object of the present invention is to provide such a locating method which reduces the number of possible positions for location of the fault on the electrical network in comparison with the known methods.

Another object of the present invention is to provide such method of fault location on an electrical network which may allow determining the nature of the fault.

Another object of the present invention is to provide a method of fault location on an electrical network implementable without expensive measuring devices that would require for example a GPS.

Another object of the present invention is to provide such a locating method that has application fields which may be advantageous in the public safety area.

According to an aspect of the invention, there is provided a method for locating a fault on an electrical network energized by a source, comprising the steps of:

measuring voltages at least three different measurement locations on the electrical network, at least one of the measurement locations being situated between the source and the fault;

determining voltage phasors corresponding to the voltages measured during the fault, the voltage phasors being time synchronized;

determining conductors of the electrical network involved in the fault as a function of characteristics of the voltage phasors corresponding to the voltages measured during the fault at one of the measurement locations;

evaluating a fault current causing a voltage drop at least one of the measurement locations with respect to an initial voltage value at said at least one of the measurement locations; and evaluating a position of the fault on the electrical network corresponding to a point of the electrical network where a ratio between:

i) a difference of the voltages measured during the fault at two of the measurement locations, and ii) an impedance between one of the two measurement locations and said point of the electrical network, depending on the conductors involved in the fault, is equal to the fault current.

BRIEF DESCRIPTION OF THE DRAWINGS

A detailed description of preferred embodiments of the invention will be given herein below with reference to the following drawings, in which like numbers refer to like elements.

DETAILED DESCRIPTION OF THE PREFERRED EMBODIMENTS

The proposed method allows locating permanent and fugitive faults on power distribution and transmission networks in service, in particular low impedance faults (e.g. lower than approximately 25 ohms). A low impedance fault generates an important current that causes a measurable voltage drop on a line (e.g. a distribution line) and typically comes with an electrical arc at the fault location, whose amplitude is function of the nature of the fault and the implicated equipment.

As an example, a tree branch getting in contact between the phases of an electrical line is, in most cases, initially comparable to a small load on the network. We then speak of a high impedance fault. The method according to the invention does not allow analyzing such faults, because they are assimilable to a load on the network and they do not cause a significant voltage drop. However, in most cases, an electrical arc may develop between the phases, producing a high current that triggers the protection of the network. When a tree branch has an important diameter, the wood carbonization produces a conductive channel prior to the breaking and falling of the branch. That fault is of a low impedance type and is located by the method according to the invention. We then speak of a high impedance fault that degrades into a low impedance fault.

The fault locating method is achieved by voltage variation measurements. The method allows more generally studying the possibilities of using wave quality measurements to provide intelligent servicing tools. The voltage measurements distributed on a network, according to the method, allow a better knowledge of the voltage supply quality and can help in the maintenance and management of the network.

Figure 1:
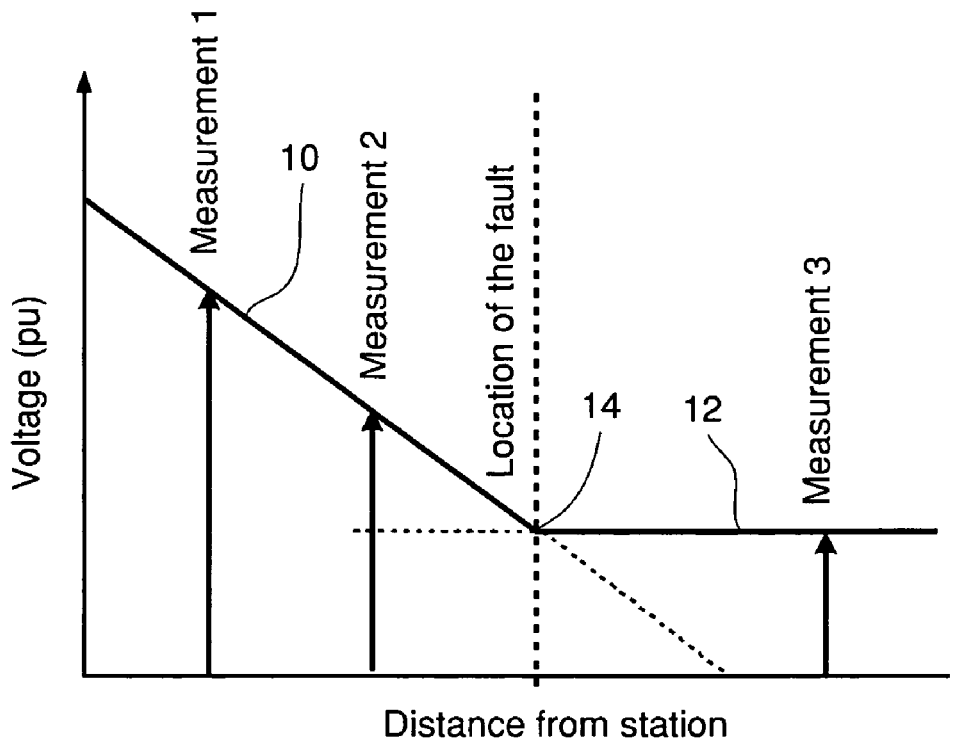
FIG. 1 is a diagram illustrating the triangulation principle of the locating method.

Referring to FIG. 1, the fault locating method is based on a triangulation technique of the voltage measurements situated at different locations of a distribution or transmission line, depending on the case.

Preferably, only the voltage variations exceeding a chosen threshold, e.g. of more than 10% or even 20%, will trigger a location according to the method. This is true for electrical networks whose neutral is strongly grounded. Such variations correspond to voltage dips in the language of the wave quality. This is why their detections and their recordings may be achieved by means of wave quality measuring devices as often found already installed on the networks, e.g. electrical meters or controllers having wave quality measuring and measurement communicating capabilities. No specialized local processing is required at the level of the measuring devices. Communication of the measurements may be achieved via any appropriate communication infrastructure (by wires, radio, etc.) preferably allowing centralization of the measurements to simplify the process. In the case where the measurements are already transmitted to a central processing system, it is then only a matter of extracting the desired measurements from the system to practice the method. The system may even be used to trigger a fault verification and location on demand or automatically.

In addition to the distance of the fault, the method allows determining the voltage at the fault location (which corresponds to the arc voltage), the intensity of the fault current, the identification of a faulty branch on a main line section and the harmonic content of the voltage during the fault (also referred to in the present disclosure by the expression fault voltage). These data help determining the nature of the fault and its in situ location.

In principle, circuit breakers using vacuum cells have a negligible arc voltage. However, in the case of other protection devices, it may be necessary to consider the arc voltage of the switchgear. In certain cases, the keeping of a good precision may require that the network model (also referred to in the present disclosure by the expression line model) includes the switchgear.

If necessary, it should be taken into account that the arc voltage calculated by the method includes the arc of the line protection device. If the device used has a significant impact, its arc voltage will be subtracted from the calculated value. Or also, it will be possible to proceed with the calculation of the arc voltage only on a time window not including the arc of the protection device.

The faults on an electrical line generally cause a voltage drop that is proportional to the current intensity. The voltage level at a location, between the source (e.g. a station) and the fault, is proportional to the distance that separates this location from the fault point. This is represented by the diagonal line 10 in FIG. 1. Conversely, the voltage level downstream from the fault location remains unchanged, if the influence of the load is excluded. This is represented by the horizontal line 12. The fault location itself corresponds to the point of intersection 14 of the two lines 10, 12.

Although the method involves various aspects such as voltage phasors, (digital) models of the distribution and/or transmission network, topological manipulations, etc., the simple representation illustrated in FIG. 1 nevertheless allows setting forth its basic principle, namely that the fault distance (or its position) is determined in a non-ambiguous way by two voltage measurement locations upstream from the fault. A third measurement location situated downstream from the fault allows determining the faulty branch and corroborating the location.

The use of three-phase voltage phasors allows considering the inductive nature of an electrical line and optimizing the number of measurement points. This would normally require a time synchronization (for example with GPS) and a precise calibration of the measurements. The cost of such measuring devices would impede the economical viability of such an application on a distribution network. The proposed method allows overcoming these requirements by a pairing of the network measurements with a model of the electrical network allowing a posteriori synchronization and calibration of the signals. Consequently, the low cost measurements, for example taken on the secondary of a distribution transformer, prove to be appropriate. The precision of the time marking of the measurements in an order of a second is sufficient, but a higher value may also be used.

An advantageous aspect of the method is to allow locating the fault despite the possible complexity of the monitored electrical network due, among other things, to a multitude of branches.

Figure 2:
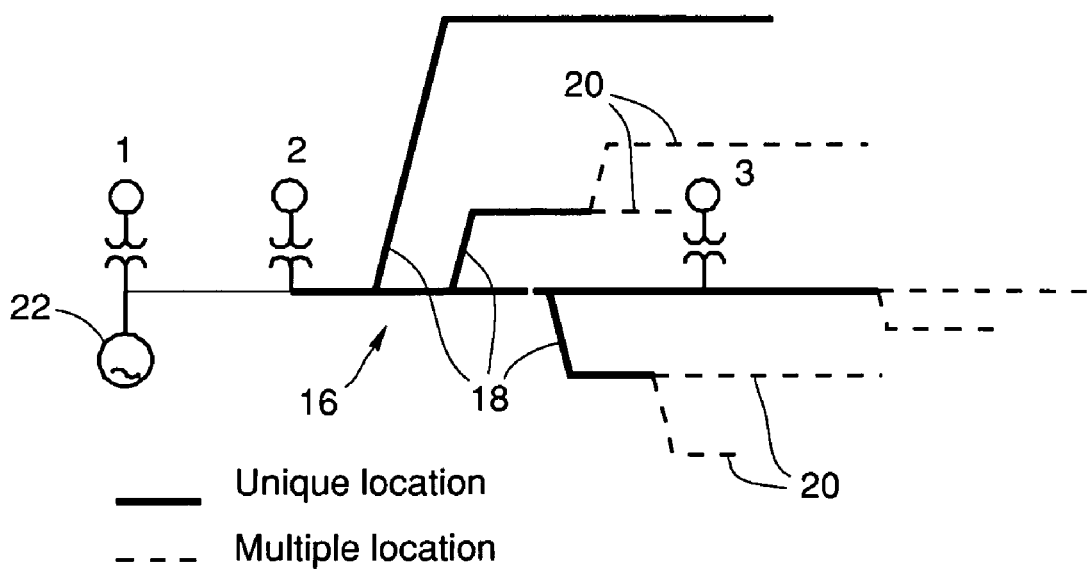
FIG. 2 is a diagram illustrating a fault location on an electrical network.

Referring to FIG. 2, there is shown an application of the method for a distribution line 16 using three measurement locations identified by points 1, 2 and 3 that may correspond for example to the low voltage electrical supply of three three-phase clients.

The location is unique for any fault that occurred directly in the axis of the three measurements. For a fault located in a branch 18, the location will be unique as long as there are no sub-branches 20. Otherwise, all the combinations due to sub-branches 20 will be considered.

The strategy surrounding the choices of the locations of measurement points and their number is determined by the particulars of each line. Two locations are preferably predetermined, for example one near the station 22 (or source) and one as close as possible to the end of a line. A third measurement location can be located approximately a quarter from the distance separating the two previous ones. For long lines, for example of over 40 km, a forth measurement location can be added to improve the precision of the location. The location near the station can in practice be at a certain distance from the station 22, provided that it can provide voltage measurements as much as possible equivalent to the source voltage with respect to the voltage measurements coming from the other locations. The location close to the end of a line is preferably such that it can provide voltage measurements equivalent to the voltage on a line section of the electrical network located past the fault.

In certain cases, two measurements can be sufficient to locate the fault. In FIG. 2, a first measurement is located at the beginning of the line. This measurement can be derived from a measurement located on another line supplied by the same source. This configuration allows measuring the voltage of the source (for example at the distribution station), without having to install a measuring device thereat. Three advantages are denoted for this configuration, namely: a decrease of the number of measurements to be implemented on each line (four measurements in total to instrument two lines, instead of six measurements); an increased location coverage; and an increase of the precision (which is proportional to the distance between the two first measurements on the line section defined by the locations of the three measurements). The voltage variation measured at this location will however be small and there is a risk that it be not considered by the voltage measuring device, because assimilable to load variations usually monitored on the network. However, small voltage variations generally occur when the fault is located far away on the line. It then appears probable that another measurement will be located closer to this fault and upstream.

Figure 3:
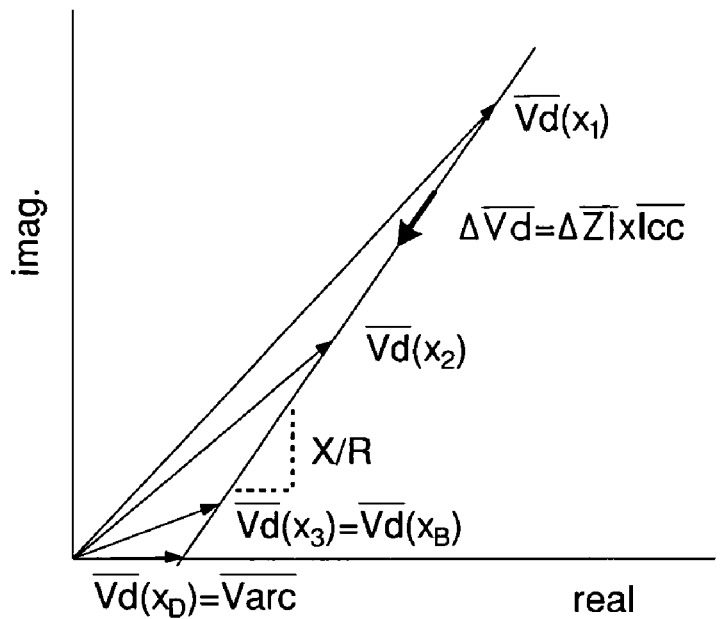
FIG. 3 is a diagram showing an example of voltage phasors during a fault.

Referring to FIG. 3, there is shown an example of a configuration of four voltage phasors at the time of a phase-neutral fault, illustrating the behaviour of a line voltage during a fault. The presence of the load is neglected here and the line impedance is considered to be homogenous. Three of the $\vec{V}d$ phasors correspond to measurements of which two are located upstream from the fault (positions $x_1$ and $x_2$) and one downstream (position $x_3$). A forth phasor (position $x_D$) correspond to the fault voltage. The line of slope X/R linking the phasors represents the voltage drop along the faulty line section called the fault path. The distances $x_1$ and $x_2$ are known and correspond to the distances of the two first measurements with respect to the station (or source). The distance $x_B$ corresponds to the distance between the station and the beginning of a faulty branch. $x_D$ indicates the distance from the station to the fault point and the line section linking the points $x_B$ and $x_D$ corresponds to the voltage drop in the branch. The values $X_B$ and $x_D$ are unknown and are to be evaluated.

Figure 4:
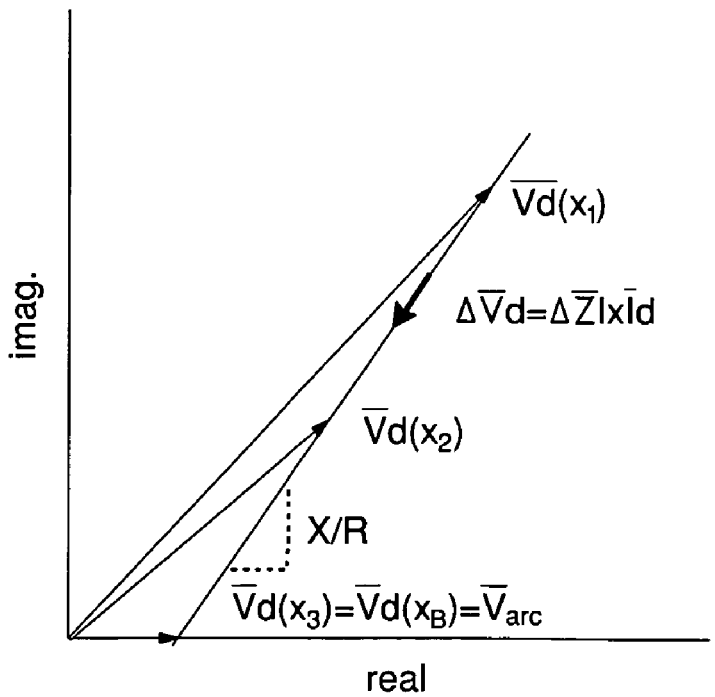
FIG. 4 is a diagram showing an example of voltage phasors during a fault located on a line section of the electrical network containing the measurements.

Referring to FIG. 4, there is shown an example of a fault located in the line section delimited by the three measurement locations.

It should be noted that in FIGS. 3 and 4, the phasor of the fault current is used as reference of the real axis. The fault is considered as purely resistive and the voltage during the fault is in phase with the current. The distance of the fault $x_D$ is thus derived by the point of intersection of the voltage phasor with the X axis (imaginary part=0). Also, the resulting phasor $V_{arc}$ indicates the voltage developed at the location of the fault.

The coefficient of the voltage drop on the path of the fault is entirely determined by the two first measurements, since it is already possible to calculate the intensity of the fault current. The third measurement is used to determine if the fault is on the main line section or in a branch and to find this branch if necessary, knowing that the voltage downstream from the branch is constant and equal to that evaluated at the beginning of the branch. The third measurement is also used to determine if the two first measurements are indeed located upstream from the fault. It also allows improving the precision of the model.

It is possible to calculate a distance of the fault, without however determining the location of a branch, with only two measurements, provided that there is a means allowing detecting that the fault occurs downstream from the second measurement. This can be ensured by a direct measurement of the line current or a telecommunicated fault indicator which is located near the second measurement. If such information is not available, the location of the fault is possible, but it will be potentially necessary to consider the two following possibilities, namely that the fault is between the two first measurements, or downstream from them.

If the influence of the load on the behaviour of the voltage phasors is excluded, it is easy to determine the fault current by the following formulae (1).

$$\vec{I}d_0 = \frac{(\vec{V}d_0(x_1) - \vec{V}d_0(x_2))}{(\vec{Z}th_0(x_2) - \vec{Z}th_0(x_1))}$$

$$\vec{I}d_+ = \frac{(\vec{V}d_+(x_1) - \vec{V}d_-(x_2))}{(\vec{Z}th_+(x_2) - \vec{Z}th_+(x_1))}$$

$$\vec{I}d_- = \frac{(\vec{V}d_-(x_1) - \vec{V}d_-(x_2))}{(\vec{Z}th_-(x_2) - \vec{Z}th_-(x_1))}$$

(1)

$\vec{V}d_{0,+,-}(x_1)$ and $\vec{V}d_{0,+,-}(x_2)$ correspond to two three-phase voltage phasors measured during the fault and located at positions $x_1$ and $x_2$ upstream from the fault. $\vec{Z}th_{0,+,-}(x_1)$ and $\vec{Z}th_{0,+,-}(x_2)$ correspond to the cumulative line impedances for those two locations.

The representation of the network by its symmetrical components, identified here by indices 0, + and −, is preferably favored, because it takes into account the voltage imbalances and allows determining any type of fault current independently from the involved phases.

The equations of the voltage phasors for a position x of the line located between the fault and the measurement location at position $x_1$ are defined as follows:

$$\vec{V}d_0(x) = \vec{V}d_0(x_1) - \vec{I}d_0 \times (\vec{Z}th_0(x) - \vec{Z}th_0(x_1))$$

$$\vec{V}d_+(x) = \vec{V}d_+(x_1) - \vec{I}d_+ \times (\vec{Z}th_+(x) - \vec{Z}th_+(x_1))$$

$$\vec{V}d_-(x) = \vec{V}d_-(x_1) - \vec{I}d_- \times (\vec{Z}th_-(x) - \vec{Z}th_-(x_1))$$

(2)

As hereinabove mentioned, at the fault location, the voltage and the current are in phase. The impedance of the fault is considered as resistive, it is why a rotation of the voltage phasors is achieved to eliminate the imaginary component of the fault current that has been evaluated with equation (1). This rotation allows simplifying the analysis, as well as the graphical presentation of the results. The following complex phasor allows achieving a rotation of the phasors of the calculated measurement voltage and the fault current:

$$\vec{R}ot = \cos(\phi) - j\sin(\phi) = e^{\phi} \tag{3}$$

Table I hereinbelow indicates the value of the rotation angle $\phi$ used in equation (3).

TABLE I

| Fault type | Rotation angle |
| --- | --- |
| Phase A, Phases A-B, Three-phase A-B-C: | $\phi = \angle \vec{I}d_A$ |
| Phase B, Phases B-C: | $\phi = \angle \vec{I}d_B$ |
| Phase C, Phases C-A: | $\phi = \angle \vec{I}d_C$ |

The evaluation of the position of the fault is made with the knowledge of the voltage phasor which is in phase with that of the fault current (purely resistive fault). This voltage phasor is evaluated differently depending on the fault type. The following table II summarizes the fault voltage phasor possibilities.

TABLE II

| Fault type | Fault voltage |
| --- | --- |
| Phase A: | $\vec{V}d(x) = \vec{V}d_A(x)$ |
| Phase B: | $\vec{V}d(x) = \vec{V}d_B(x)$ |
| Phase C: | $\vec{V}d(x) = \vec{V}d_C(x)$ |
| Phases A-B: | $\vec{V}d(x) = \vec{V}d_A(x) - \vec{V}d_B(x)$ |
| Phases B-C: | $\vec{V}d(x) = \vec{V}d_B(x) - \vec{V}d_C(x)$ |
| Phases C-A: | $\vec{V}d(x) = \vec{V}d_C(x) - \vec{V}d_A(x)$ |
| Three-phase A-B-C: | $\vec{V}d(x) = \vec{V}d_A(x)$ |

The location method comprises different steps in order to calibrate the measurements, to synchronize the phasors, to simplify the network model, to order the measurements, to compensate the fault voltage phasors for the contribution of the load current, to identify the fault type, and to determine the technique to be used depending on the position of the fault with respect to the measurements.

Figure 5:
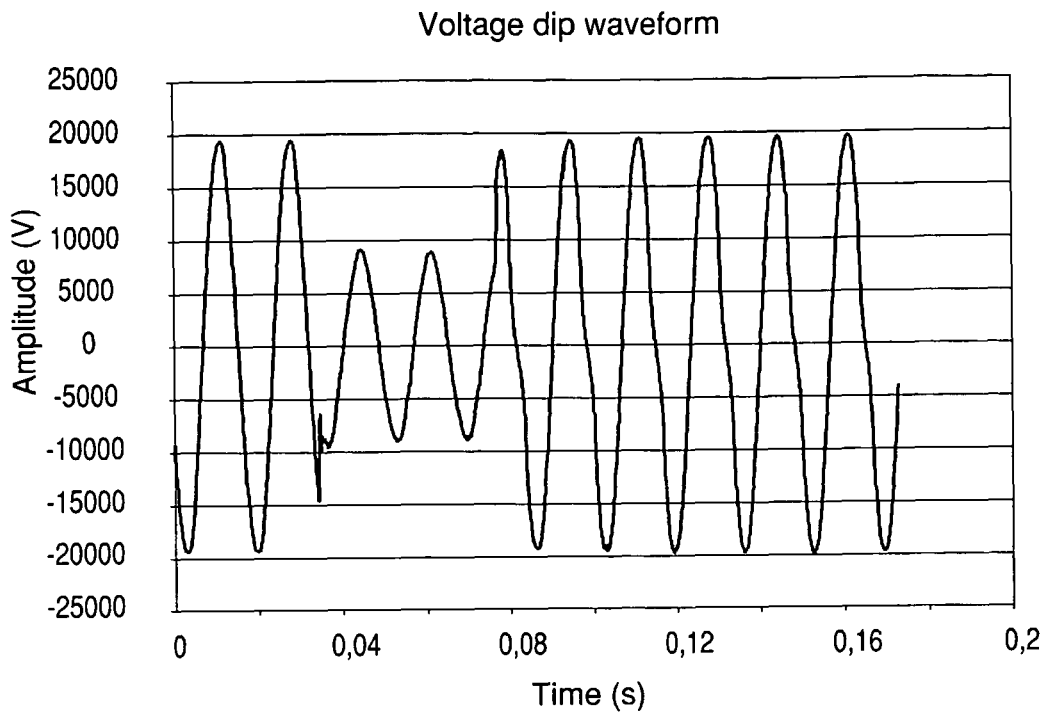
FIG. 5 is a graph illustrating a fault waveform.

Referring to FIG. 5, there is shown an example of voltage measurement taken during a fault using a wave quality measuring device. Only the waveform of the faulty phase is shown.

The precision obtained on the location of the faults depends in part on the synchronization of the signals obtained at the measurement locations. The graph in FIG. 5 represents a typical signal to be analyzed. The voltage phasors showed in FIGS. 3 and 4 are subjected to a synchronization preferably below one degree and are calculated from this type of signal.

This synchronization may be achieved in three steps. The first one consists in regrouping the measured signals, coming from the distributed measurement locations, according to the time of the recording using a time marking of the internal clock of the measuring apparatuses. The precision of this marking is in the order of the second if the devices are resynchronized on a regular basis as it is the case for those set in network or during modem communication. The second step consists in synchronizing all the signals, first regrouped, using the beginning of the perturbation which is represented by a quick voltage variation. The latter may be synchronized on each measuring device at some milliseconds since they record the beginning of the phenomenon at the same time. On distances in the order of 100 km, the propagation delay of the wave front is lower than 0.33 ms and can be taken into account even if it proves to be negligible. The synchronization ends by a final setting (fine synchronization) based on the portion of the signal just before the fault.

A technique used in the final step is presented hereinafter as being part of the signal calibration technique.

The second step may, for example, use as a marker a difference of the RMS amplitudes between two consecutive cycles. Considering $dVrms_i$, evaluated by the following formulae (4):

$$dVrmsA_n = \sqrt{\frac{\sum_{i=n-N}^{n} V_A(i)^2}{N}} - \sqrt{\frac{\sum_{i=n}^{n+N} V_A(i)^2}{N}} \tag{4}$$

or 0 if the difference is negative $$dVrmsB_n = \sqrt{\frac{\sum_{i=n-N}^{n} V_B(i)^2}{N}} - \sqrt{\frac{\sum_{i=n}^{n+N} V_B(i)^2}{N}}$$

or 0 if the difference is negative $$dVrmsC_n = \sqrt{\frac{\sum_{i=n-N}^{n} V_C(i)^2}{N}} - \sqrt{\frac{\sum_{i=n}^{n+N} V_C(i)^2}{N}}$$

or 0 if the difference is negative $$dVrms_n = dVrmsA_n + dVrmsB_n + dVrmsC_n$$

Variables $V_A(i)$, $V_B(i)$ and $V_C(i)$ correspond to the voltage values of the signal for the three phases at the index i of the sampled signal. N corresponds to the number of points sampled in a cycle at the network frequency. The dVrms values are evaluated starting from position N and ending at that corresponding to the total number of points minus N.

The continuation of the process sums up in finding the first significant local maximum of this set of dVrms values.

The absolute maximum and minimum are thus then evaluated over the totality of the dVrms values, i.e.: $dVrms_M$ and $dVrms_m$. Starting with the index n=N, the following condition is evaluated:

$$dVrms_n > dVrms_m + Seuildv \times (dVrms_M - dVrms_m)$$

The Seuildv coefficient may be set to 0.1. The first index n satisfying to the condition, hereinabove identified by Id, is the start of the search for the first significant maximum of the set of dVrms values that usually correspond to the beginning of the fault represented by the isynch value.

$$isynch = indice(MAX[dVrms_{id}, dVrms_{id+1}, \ldots dVrms_{id+N}]) \tag{5}$$

The start indices of the fault are kept to mark the boundary between the signals before and during the fault which will be used for the calculations of the phasors before and during the fault. The precision of this synchronization is function, mainly, of the number of samples of the voltage signal per cycle used. A precision of the order of 3° on the phasor may be considered for a sampling rate of 128 points per cycle. The precision of the synchronization may be improved by synchronization and calibration of the phasors as described hereinafter.

The voltage and load current phasors corresponding to the measurement locations may be obtained by a discrete Fourier transform calculation over a sampling window equivalent to a cycle. The beginning of the sampling window is established from the indices found in respect with the beginning of the fault. Preferably, the process begins at least one cycle before the index marking the beginning of the fault to determine the state of the phasors before the fault. To find the phasors at the time of the fault, an index shifted (forward) by a fraction of a cycle from this same marker can be used.

Determination of the location of the fault is based on the use of voltage measurements coming from locations that may be situated directly on the medium voltage side in the case of a distribution line or on the high voltage side for a transmission line. However, the measurement distribution in measurement points at the clients is favored, since it allows using low cost devices and an easy installation, but the distribution transformer introduces an error in the voltage measurement. For a measurement point located on the low voltage side and used to locate faults on a distribution line, a compensation is achieved for the voltage drop caused by the load current on the impedance of the transformer in order to find out the corresponding voltage at the primary. The impedance of each distribution transformer is then used.

Figure 14:
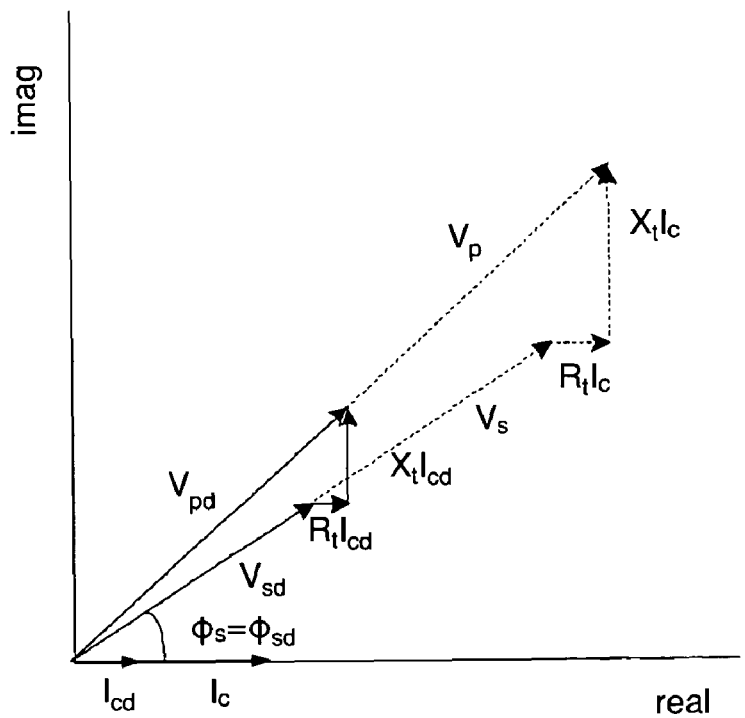
FIG. 14 is a diagram illustrating a voltage variation across terminals of a distribution transformer during a fault for a linear load.

Referring to FIG. 14, there is shown the effect of a purely passive load on the voltage during the fault. Only the faulty phase is represented. It can be noticed that the proportions are preserved between the voltage read before and during the fault compared with that measured at the secondary of a transformer. The phase angles do not change. This characteristic of a transformer can be used as basis for the development of a calculation method. It allows easy correction of the amplitude error caused by the load current, as explained hereinafter in respect with the precise synchronization and the calibration.

The nonlinear loads and the counter-electromotive ones, among which induction motors form a part, may oppose to the voltage amplitude change.

Figure 15:
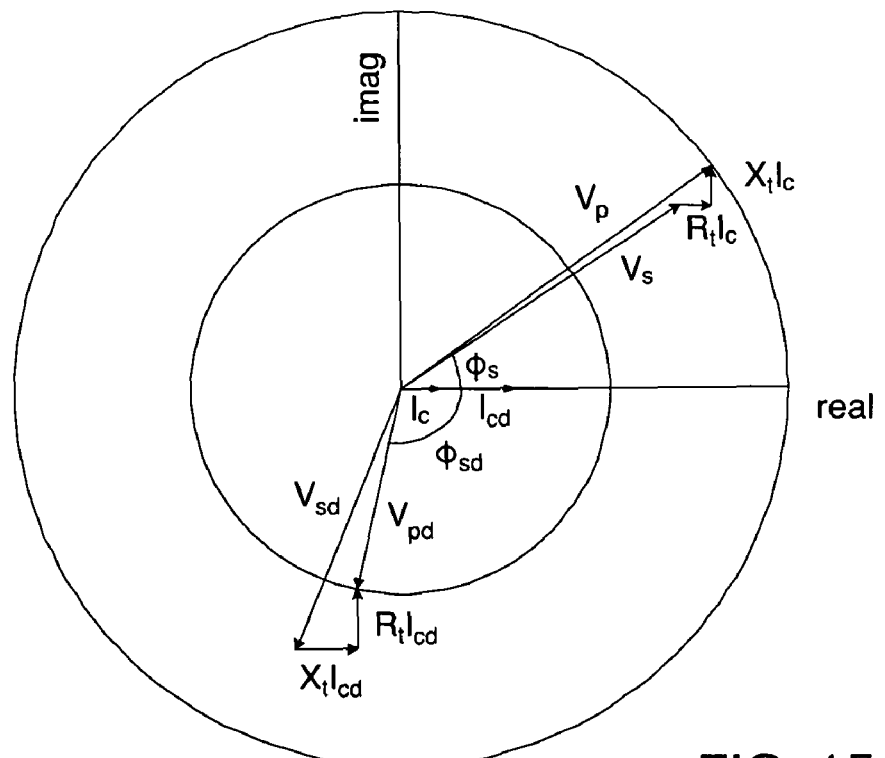
FIG. 15 is a diagram illustrating a voltage variation across terminals of a transformer during a fault for a counter-electromotive load.

Referring to FIG. 15, there is shown the effect of such loads on the behavior of the voltage phasors situated at the primary or the secondary of distribution transformers and that for the faulty phase.

Figure 16:
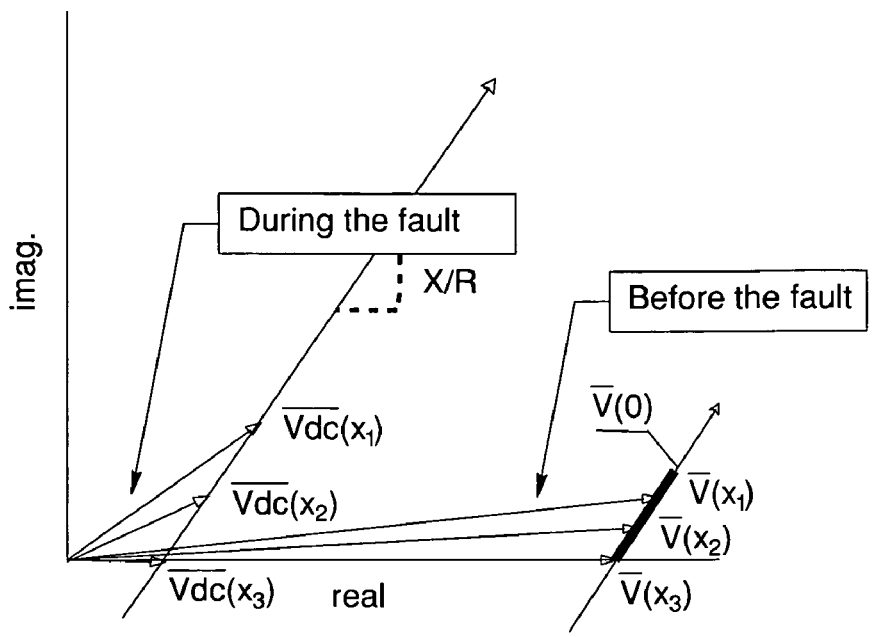
FIG. 16 is a diagram illustrating an example of voltage phasors for three measurement locations before and during the fault.

By taking the currents before and during the fault ($I_c$ and $I_{pd}$) as reference of the real axis, a change of state of the impedance of a motor is noticed. Before the fault, the voltage is ahead with respect to the current, which is normal for an inductive load. During the fault, the order is reversed and the current leads the voltage, which means that the motor acts as a capacitive element. If the contribution of the motor is neglected, the voltage taken during the fault at the primary of a transformer ($V_{pd}$) must be identical to that which would be generated by a passive load if it was located at the same place. The two voltages $V_{pd}$ of the diagrams of FIGS. 15 and 16 having identical moduli, it is noticed that the voltage at the secondary ($V_{sd}$) decreases in the case of a passive load and increases for an induction motor.

The following formulae allow correcting the three-phase voltage phasors.

$$Vpt = Vst + ZT \times Ict \quad (8)$$

$$Vpt = \begin{bmatrix} \vec{Vpt_A} \\ \vec{Vpt_B} \\ \vec{Vpt_C} \end{bmatrix}$$

$$Ict = \begin{bmatrix} \vec{Ict_A} \\ \vec{Ict_B} \\ \vec{Ict_C} \end{bmatrix}$$

$$ZT = \begin{bmatrix} \vec{Zt} & 0 & 0 \\ 0 & \vec{Zt} & 0 \\ 0 & 0 & \vec{Zt} \end{bmatrix}$$

Vpt represents the three-phase voltage phasor at the primary of the distribution transformer and Vst that at the secondary. The voltage drop is represented by the product of the impedance of the transformer ZT and the load current of the transformer measured during the fault Ict. The method implies that all the measured voltage phasors be corrected by formula (8) if the measurement locations are situated at the secondaries of distribution transformers.

The following table III sums up the characteristic values of impedances used for typical distribution transformers.

TABLE III

| Power | Impedance | | Zt | |
|---|---|---|---|---|
| (kVA) | (%) | Full load loss (W) | R (Ω) | X (Ω) |
| 25 | 1.5 | 247 | 82 | 93 |
| 50 | 1.57 | 416 | 34.5 | 55.3 |
| 100 | 2 | 745 | 15.5 | 38.5 |
| 167 | 1.9 | 1117 | 8.3 | 22.1 |

In order to simplify the line model and simplify the calculation of the fault location, the measurements are ordered following their position on the path of the fault which is defined as the path followed by the fault current from the source up to the fault location. But there are two reasons that may affect this order: the reconfiguration of the network (dynamic state), and the position of the measurement locations in the tree structure of the line with respect to the fault path. Presuming that the dynamic configuration of the fault is known, a measurement location that is not situated directly on the path of the fault is considered as positioned at the intersection between the branch of the network containing the measurement location and the path of the fault. This location is referred to as being the projection of the measurement point onto the fault path.

This ordering of the measurement locations normally implies that the fault path be known. But is it not the case at this stage of the analysis. It is possible to use a technique solely based on the measured voltage level regardless of the line topology. The higher the measured voltage is, the closer from the source the point will be considered.

Figure 6:
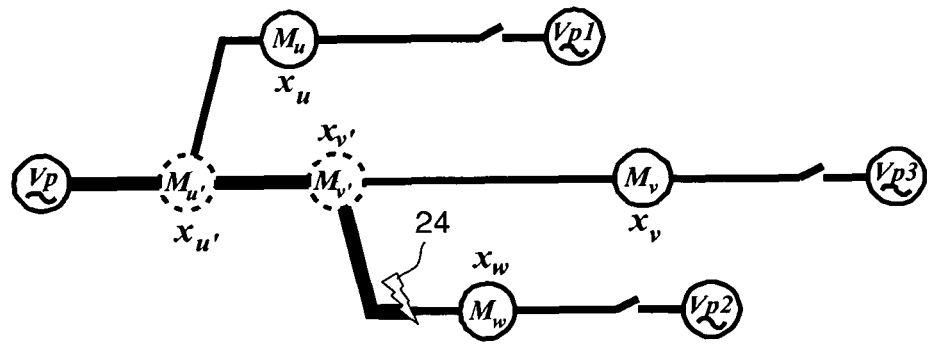
FIG. 6 is a diagram showing an example of orientation of the measurements.
Figure 7:
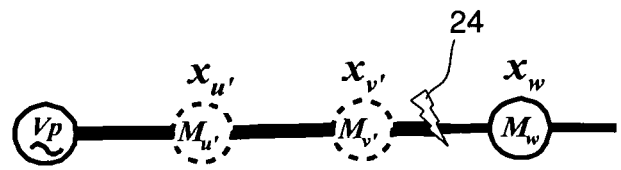
FIG. 7 is a diagram illustrating a simplified representation of the measurements projected on an analysis line section.

Referring to FIG. 6, there are shown measurement locations for a three branch line configuration. The values $M_U$, $M_V$ and $M_W$ correspond to the physical locations of the measurements. A fault, located in the branch of $M_W$, is given as an example to illustrate the method. The fault path is identified in bold (thicker line segments) with respect to the other segments of the line. The following order will then be obtained for the voltage measurements during the fault: $Vd_U > Vd_V > Vd_W$. As the physical locations $M_U$ and $M_V$ are not on the path of the fault, it is possible to assert, by excluding the voltage drop due to the load current on the line, that they exhibit voltage phasors equal to what physical measurement locations situated respectively at the locations $M_U'$ and $M_V'$ would measure while being located at distances of $x_U'$ and $x_V'$ from the source. The locations $M_U'$ and $M_V'$ are identified as the projections of $M_U$ and $M_V$ on the path of the fault. The line section formed by the source and the physical points $M_U'$, $M_V'$ and $M_W$ corresponds to the main line section that is shown in FIG. 7.

The technique presented here finds the order of the measurement locations and defines the main line section for all the fault types (phase A-Neutral, phase B-Neutral, phase C-Neutral, phases A-B, phases B-C, phases C-A, phases A-B-C, phases A-B-C-Neutral).

To carry out an ordering of the measurement locations, a first calculation of voltage phasors, measured before and during the fault, is produced for each phase. The voltage phasors in fault condition are determined in the manner described hereinabove.

The ratios between the moduli of the three-phase voltage phasors identified A, B and C measured before ($V_{A,B,C}$) and during the fault ($Vd_{A,B,C}$) are calculated.

For three measurement locations $M_U$, $M_V$ and $M_W$, the ratios of the voltage amplitudes before and during the fault are obtained:

$$\gamma_{AU} = \frac{|\vec{V}d_{AU}|}{|\vec{V}_{AU}|}, \gamma_{BU} = \frac{|\vec{V}d_{BU}|}{|\vec{V}_{BU}|}, \gamma_{CU} = \frac{|\vec{V}d_{CU}|}{|\vec{V}_{CU}|} \quad (9)$$

$$\gamma_{AV} = \frac{|\vec{V}d_{AV}|}{|\vec{V}_{AV}|}, \gamma_{BV} = \frac{|\vec{V}d_{BV}|}{|\vec{V}_{BV}|}, \gamma_{CV} = \frac{|\vec{V}d_{CV}|}{|\vec{V}_{CV}|}$$

$$\gamma_{AW} = \frac{|\vec{V}d_{AW}|}{|\vec{V}_{AW}|}, \gamma_{BW} = \frac{|\vec{V}d_{BW}|}{|\vec{V}_{BW}|}, \gamma_{CW} = \frac{|\vec{V}d_{CW}|}{|\vec{V}_{CW}|}$$

The sum of the ratios of each one of the phases allows globalizing the voltage drop per measurement point. The obtained values γ determine the amplitude of the voltage variation independently from the fault type which is still unknown at this stage of the analysis.

$$\gamma_U = \gamma_{AU} + \gamma_{BU} + \gamma_{CU}$$

$$\gamma_V = \gamma_{AV} + \gamma_{BV} + \gamma_{CV}$$

$$\gamma_W = \gamma_{AW} + \gamma_{BW} + \gamma_{CW} \quad (10)$$

Figure 8:
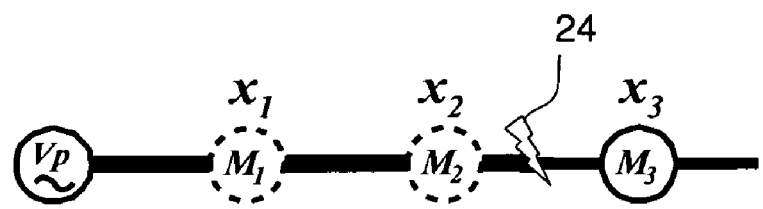
FIG. 8 is a diagram illustrating a simplified representation of the ordered measurements.

The measurement point where γ is lower is considered as end of the main line section (analysis path). The main line section itself is made of all the predecessors of this point by going upstream up to the source. The other measurement points are then projected on the main line section. It is expected that the order of these projections on the line section starting from the station corresponds to the decreasing order of the $\gamma_W$, $\gamma_V$, $\gamma_U$ values. If such is the case, the measurement points are renamed according to the convention $M_1$, $M_2$ and $M_3$ and the corresponding distances $x_1$, $x_2$ and $x_3$ of the projections with respect to the beginning of the line on the main line section are evaluated. The result of this new convention is represented in FIG. 8. In the example, $\gamma_W$ corresponds to the lower value that is always associated to the location $M_3$, while $M_W$ is associated with $M_3$. In the opposite case, a discrepancy will possibly be notified by the system carrying out the method as explained hereinafter.

In certain network configurations, the order may be reversed, for example a load transfer that happens unnoticed by the fault location system so that the line is supplied by the source Vp2 instead of Vp. The fault voltage measurements will thus be in the following order: $Vd_W > Vd_V > Vd_U$. The order presumed by this technique will be compared with the information on the network configuration such as the distance between the measurement points and the presumed source i.e. Vp and the eventual discrepancies will be notified.

For the continuation of the method, the following convention is used, i.e.:

$$V(x_1) = \begin{bmatrix} \vec{V}_A(x_1) \\ \vec{V}_B(x_1) \\ \vec{V}_C(x_1) \end{bmatrix}$$

is the three-phase voltage phasor as measured before the fault at the physical location $M_1$ on the main line section, $$Vd(x_1) = \begin{bmatrix} \vec{Vd}_A(x_1) \\ \vec{Vd}_B(x_1) \\ \vec{Vd}_C(x_1) \end{bmatrix}$$

is the three-phase voltage phasor as measured during the fault at the physical location $M_1$ on the main line section, $$V(x_2) = \begin{bmatrix} \vec{V}_A(x_2) \\ \vec{V}_B(x_2) \\ \vec{V}_C(x_2) \end{bmatrix}$$

is the three-phase voltage phasor as measured before the fault at the physical location $M_2$ on the main line section, $$Vd(x_2) = \begin{bmatrix} \vec{Vd}_A(x_2) \\ \vec{Vd}_B(x_2) \\ \vec{Vd}_C(x_2) \end{bmatrix}$$

is the three-phase voltage phasor as measured during the fault at the physical location $M_2$ on the main line section, $$V(x_3) = \begin{bmatrix} \vec{V}_A(x_3) \\ \vec{V}_B(x_3) \\ \vec{V}_C(x_3) \end{bmatrix}$$

is the three-phase voltage phasor as measured before the fault at the physical location $M_3$ on the main line section, $$Vd(x_3) = \begin{bmatrix} \vec{Vd}_A(x_3) \\ \vec{Vd}_B(x_3) \\ \vec{Vd}_C(x_3) \end{bmatrix}$$

is the three-phase voltage phasor as measured during the fault at the physical location $M_3$ on the main line section.

Likewise, the use of the symmetrical components of the voltage phasors identified by the indices 0, + and − are also used.

Figure 9:
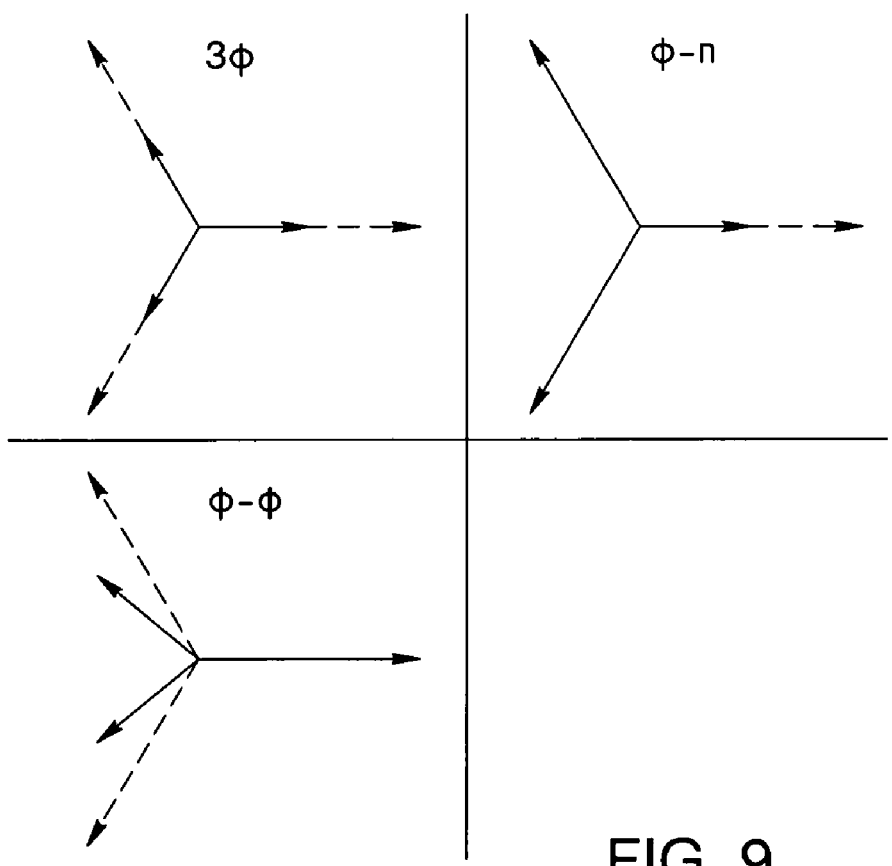
FIG. 9 is a diagram illustrating three-phase phasors according to different fault types.

The following analysis determines the fault type i.e.: ϕ-n, ϕ-ϕ or 3ϕ. The diagram of FIG. 9 shows these fault types.

The farthest measurement from the station on the main line section ($M_3$ at a distance $x_3$) is preferably used to evaluate the fault type, since the voltage drop at this location is greater. By comparing the amplitudes and the phases of the voltage signal, the fault type is determined. The voltage phasors as calculated in the ordering of the measurements are used. The three-phase voltage phasors measured before ($V(x_3)$) and during the fault ($Vd(x_3)$) are determined by calculations.

The voltage phasors in fault condition are normalized with respect to those before the fault and with respect to the mean voltage drop.

$$\vec{V}d_{Ar}(x_3) = \frac{\vec{V}d_A(x_3)}{|\vec{V}_A(x_3)| \times MoyPN} \quad (11)$$

$$\vec{V}d_{Br}(x_3) = \frac{\vec{V}d_B(x_3)}{|\vec{V}_B(x_3)| \times MoyPN}$$

$$\vec{V}d_{Cr}(x_3) = \frac{\vec{V}d_C(x_3)}{|\vec{V}_C(x_3)| \times MoyPN}$$

$$MoyPN = \frac{|\vec{V}d_A(x_3)| + |\vec{V}d_B(x_3)| + |\vec{V}d_C(x_3)|}{|\vec{V}_A(x_3)| + |\vec{V}_B(x_3)| + |\vec{V}_C(x_3)|}$$

Likewise, the voltage phasors ϕ-ϕ are calculated.

$$\vec{V}_{AB}(x_3) = \vec{V}_B(x_3) - \vec{V}_A(x_3)$$

$$\vec{V}_{BC}(x_3) = \vec{V}_C(x_3) - \vec{V}_B(x_3)$$

$$\vec{V}_{CA}(x_3) = \vec{V}_A(x_3) - \vec{V}_C(x_3)$$

$$\vec{V}d_{AB}(x_3) = \vec{V}d_B(x_3) - \vec{V}d_A(x_3)$$

$$\vec{V}d_{BC}(x_3) = \vec{V}d_C(x_3) - \vec{V}d_B(x_3)$$

$$\vec{V}d_{CA}(x_3) = \vec{V}d_A(x_3) - \vec{V}d_C(x_3) \quad (12)$$

The voltage phasors ϕ-ϕ are also normalized with respect to those before the fault and with respect to the mean voltage drop.

$$Vd_{ABr}(x_3) = \frac{\vec{V}d_{AB}(x_3)}{|\vec{V}_{AB}(x_3)| \times MoyPP} \quad (13)$$

$$Vd_{BCr}(x_3) = \frac{\vec{V}d_{BC}(x_3)}{|\vec{V}_{BC}(x_3)| \times MoyPP}$$

$$Vd_{CAr}(x_3) = \frac{\vec{V}d_{CA}(x_3)}{|\vec{V}_{CA}(x_3)| \times MoyPP}$$

$$MoyPP = \frac{|\vec{V}d_{AB}(x_3)| + |\vec{V}d_{BC}(x_3)| + |\vec{V}d_{CA}(x_3)|}{|\vec{V}_{AB}(x_3)| + |\vec{V}_{BC}(x_3)| + |\vec{V}_{CA}(x_3)|}$$

The following table IV sums up the tests allowing determining the fault type. The tests are preferably made in the order shown in the table.

TABLE IV

| Tests | Fault type |
|---|---|
| $\frac{|\vec{V}d_A(x_3)|}{|\vec{V}_A(x_3)|} <$ seuil AND | |
| $\frac{|\vec{V}d_B(x_3)|}{|\vec{V}_B(x_3)|} <$ seuil AND | 3ϕ |
| $\frac{|\vec{V}d_C(x_3)|}{|\vec{V}_C(x_3)|} <$ seuil | |
| $\vec{V}d_{Br}(x_3) > 1$ AND $\vec{V}d_{Cr}(x_3) > 1$ | ϕAn |
| $\vec{V}d_{Ar}(x_3) > 1$ AND $\vec{V}d_{Cr}(x_3) > 1$ | ϕBn |
| $\vec{V}d_{Ar}(x_3) > 1$ AND $\vec{V}d_{Br}(x_3) > 1$ | ϕCn |
| $\vec{V}d_{BCr}(x_3) > 1$ AND $\vec{V}d_{CAr}(x_3) > 1$ | ϕAB |
| $\vec{V}d_{ABr}(x_3) > 1$ AND $\vec{V}d_{CAr}(x_3) > 1$ | ϕBC |
| $\vec{V}d_{ABr}(x_3) > 1$ AND $\vec{V}d_{BCr}(x_3) > 1$ | ϕCA |

The seuil value in table IV corresponds to the three-phase voltage dip detection limit. It may be set, for example, to 0.8.

A theoretical model of the line representing the main line section in the fault location method is favored for the following reasons. First, it provides the theoretical phase shift of the voltage between the different measurement points for a given load level before the fault. This phase shift is used to correct the phase angle of the measured voltage phasors. A more precise resynchronization of the signal is obtained in this way. The details of the use of this resynchronization technique are explained hereinafter. Second, the distribution transformers, the measuring device and the temperature are all factors that influence the amplitude of the obtained measurements. It is difficult to perfectly know the influence of these factors and even harder to apply an appropriate correction. The relation between the voltage amplitudes obtained from the model building and those measured a few moments before the fault allows a correction on the moduli of the voltage phasors measured during the fault. This self-calibration of the measurements is also explained hereinafter. Finally, the theoretical simulated values allow eliminating the contribution of the load current to the voltage phasors measured during the fault as described hereinafter.

The following formulae correspond to the equations of the three-phase current Is evaluated for a line section situated between the distances x and x+Δx on the main line section. A Δx of 20 m is favored, but it may be set at another value if desired.

$$Is(x + \Delta x) = Is(x) - Id(x) - Ic(x) \quad (14)$$

$$Is(x) = \begin{bmatrix} \vec{I}_A(x) \\ \vec{I}_B(x) \\ \vec{I}_C(x) \end{bmatrix}$$

$$Id(x) = \begin{bmatrix} \vec{I}d_A(x) \\ \vec{I}d_B(x) \\ \vec{I}d_C(x) \end{bmatrix}$$

$$Ic(x) = \begin{bmatrix} \vec{I}c_A(x) \\ \vec{I}c_B(x) \\ \vec{I}c_C(x) \end{bmatrix} = \begin{bmatrix} \vec{V}_A(x) \times \vec{Y}_A(x) \\ \vec{V}_B(x) \times \vec{Y}_B(x) \\ \vec{V}_C(x) \times \vec{Y}_C(x) \end{bmatrix}$$

-continued $$\vec{Y}_A(x) = \frac{\sum_{x}^{x+\Delta x} \vec{V}A_A(x)}{Vn^2}$$

$$\vec{Y}_B(x) = \frac{\sum_{x}^{x+\Delta x} \vec{V}A_B(x)}{Vn^2}$$

$$\vec{Y}_C(x) = \frac{\sum_{x}^{x+\Delta x} \vec{V}A_C(x)}{Vn^2}$$

The current Ic(x) corresponds to the current attributable to the loads situated between the positions x and x+Δx and is evaluated by the approximation of the connected load VA(x) according to the following formula:

$$\frac{\sum_{x}^{x+\Delta x} \vec{V}A(x)}{Vn^2}$$

where Vn is the specified rated voltage. In the model, VA(x) may be obtained from the available information on clients supplied by the line. Generally, this information sums up to the power rating of the installed transformers. A load factor and a power factor may be used to modulate the power rating of the transformers to obtain means power values close to reality. The load factor may be modulated following models that are function of the outer temperature, the time of the day and the date.

If the main line section contains a branch between the positions x and x+Δx, then all the loads contained in the branch will be added to VA(x) to include the current attributable to the loads of that branch in the line model.

The fault current is evaluated by Id(x) and represents a heavy concentrated load. During the simulation of the model, the function Id(x) is nil for any position of the line except at the location $x_b$ that corresponds to the location of the faulty branch. At this point, this function is equal to the fault current phasors evaluated according to equation (1) while taking into account the fault type, i.e. phase-neutral, phase-phase or otherwise. The voltage phasors of the measurement points $M_1$ and $M_2$ used for the calculation of the fault current have been synchronized by the use of the index produced by formula (5).

The line voltage equations are as follows:

$$Vs(x + \Delta x) = Vs(x) - \Delta Z(x) \times Is(x) \quad (15)$$

$$Vs(x) = \begin{bmatrix} \vec{V}s_0(x) \\ \vec{V}s_+(x) \\ \vec{V}s_-(x) \end{bmatrix}$$

$$Is(x) = \begin{bmatrix} \vec{I}s_0(x) \\ \vec{I}s_+(x) \\ \vec{I}s_-(x) \end{bmatrix}$$

-continued $$\Delta Z(x) = \begin{bmatrix} \vec{Z}th_0(x+\Delta x) - \vec{Z}th_0(x) & 0 & 0 \\ 0 & \vec{Z}th_+(x+\Delta x) - \vec{Z}th_+(x) & 0 \\ 0 & 0 & \vec{Z}th_-(x+\Delta x) - \vec{Z}th_-(x) \end{bmatrix}$$

The symmetrical components are used, in order to take into account the load imbalance. There may be an error due to the geometry of the line. However, it is deemed negligible and it is considered that a transposition of the phases is carried out at a regular interval. The model may be improved if the complete matrix of the line impedances is known.

The transformation of the symmetrical components in real phasors is carried out using the Fortescue formulae:

$$V_{ABC}(x) = V_{0+-}(x) \times T \quad (16)$$

$$I_{ABC}(x) = I_{0+-}(x) \times T$$

$$V_{0+-}(x) = V_{ABC}(x) \times T_{inv}$$

$$I_{0+-}(x) = I_{ABC}(x) \times T_{inv}$$

$$T = \begin{bmatrix} 1 & 1 & 1 \\ 1 & a^2 & a \\ 1 & a & a^2 \end{bmatrix}$$

$$T_{inv} = \frac{1}{3}\begin{bmatrix} 1 & 1 & 1 \\ 1 & a & a^2 \\ 1 & a^2 & a \end{bmatrix}$$

$$a = -\frac{1}{2} + j\frac{\sqrt{3}}{2}$$

$$a^2 = -\frac{1}{2} - j\frac{\sqrt{3}}{2}$$

The use of equations (14) and (15) requires the knowledge of the initial voltage and current values at the position x=0. These values may be determined by the shooting method. This method implies that a first approximation of the voltage and current values for the position x=0 be set out. The voltages are set at the corresponding value of the specified rated voltage (Vn) and the first station (or source) current values are set to zero.

$$\vec{V}s_0(0)=0 \; \vec{I}s_0(0)=0$$

$$\vec{V}s_+(0)=Vn\angle 0° \text{ et } \vec{I}s_+(0)=0$$

$$\vec{V}s_-(0)=0 \; \vec{I}s_-(0)=0 \quad (17)$$

Equations (14) and (15) are evaluated starting from the station (x=0) and this, up to the end of the main line section, i.e. up to the position of the last load situated on this line portion. The residual current εIs found at the end of this integration is subtracted from the initial value and the line voltages are reset to the specified rated voltage.

$$\vec{V}s_0(0)=0 \; \vec{I}s_0(0)=\vec{I}s_0(0)_{précédant}-\epsilon \vec{I}s_0$$

$$\vec{V}s_+(0)=Vn\angle 0° \text{ et } \vec{I}s_+(0)=\vec{I}s_+(0)_{précédant}-\epsilon \vec{I}s_+$$

$$\vec{V}s_-(0)=0 \; \vec{I}s_-(0)=\vec{I}s_-(0)_{précédant}-\epsilon \vec{I}s_- \quad (18)$$

The evaluation of formulae (14) and (15) is done again using the new initial values of $I(0)_{0+-}$ that have been calculated from (18). The moduli of $\epsilon \vec{I}_{s_{0+-}}$ are evaluated at the end of each iteration and the evaluation process ends when they are lower to 0.1% of the moduli of the currents $Is(0)_{0+-}$ or another stop value if desired. The initial current values at the beginning of the line are now adjusted to take into account the voltage drop caused by the load and fault current. The model may then be used to evaluate the voltage and current phasors for different positions on the line section and in different load conditions before and during the fault.

A calibration of the amplitude of the phasors and a correction of the phase angle are achieved to compensate the error on the measurement and to improve the synchronization. The voltage phasors measured before the fault are calculated beforehand and ordered as described to set the measurements in order.

A technique used for the correction may use a model of the line to improve the synchronization and the calibration of the voltage phasors of the measurement points. Any model allowing representing the voltage and current phasors for any location of the line may be used. The model hereinabove presented and using formulae (14), (15), (16), (17) and (18) fulfills this purpose.

A technique that may be used for the calibration and precise synchronization of the voltage phasors consists in comparing the modeled phasors with those measured before the fault. The amplitude ratios and the angle differences obtained are used to correct the phasors measured during the fault.

The simplest case of this technique corresponds to an overhead distribution line without any load and whose capacitive effect, which is negligible, is excluded. All the voltage phasors measured along the line before the fault must have the same amplitudes and the same phase angles. If there is a difference, it comes from the error of the measurement and the synchronization error of the measurement. The correction of the amplitude and the phase angle of the phasors is then possible. It is sufficient to take one of the phasors as a reference and to find the amplitude ratios and the corresponding angle differences with all the other phasors. These values allow correcting all the phasors in a relative way with respect to the reference phasor. As the voltage phasors before and during the fault are obtained from the same signal, the same amplitude and phase correction can be applied to the phasors measured during the fault.

Figure 17:
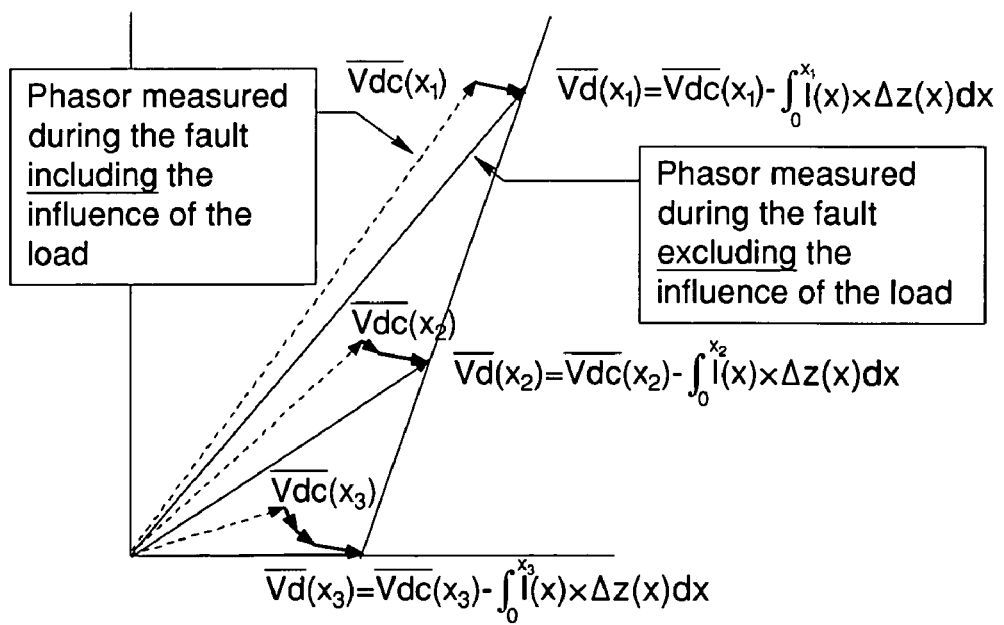
FIG. 17 is a diagram illustrating an example of voltage phasors during the fault with and without influence of the load current.

For an evaluation and especially a precise synchronization, the influence of the load is considered. It is for this reason that a detailed line model building is appropriate. The model explained hereinabove is suitable for this purpose. Other models may however be used if desired. An evaluation of the load level of the line before the fault is achieved. It does not require a great precision and can be approximated by using load current measurements at the station or by evaluating a theoretical profile of the load of the line as a function of the temperature, the date, the time and other parameters that may influence it. The graph of FIG. 17 schematically shows the variation of the voltage phasors following a determined load level of the line. A single phase is represented here as an example. Due to the load, the phase angle of the voltage and the amplitude decrease when going away from the source V(0). It must be noted that the current phasor at the beginning of the line is taken as a reference of the real axis.

The line model as presented above allows finding the theoretical amplitudes and phases of all the voltage phasors before the fault. The ratio between the measured amplitudes and those simulated is used as a reference for the calibration of the measurements. Likewise, the difference between the phase angles of each measurement and those simulated by the line model will be used to resynchronize the phasors. These corrections will be applicable directly to the phasors measured during the fault, since the phasors before and during the fault are determined from the same sampling window and are thus synchronized.

The correction of the measured phasors from the simulated ones is achieved with the following formulae:

$$Vdc(x_i) = k(x_i) \times Vdm(x_i) \qquad (22)$$

$$Vdc(x_i) = \begin{bmatrix} \vec{Vdc}_A(x_i) \\ \vec{Vdc}_B(x_i) \\ \vec{Vdc}_C(x_i) \end{bmatrix}$$

$$k(x_i) = \begin{bmatrix} \vec{k}_A(x_i) & \vec{k}_B(x_i) & \vec{k}_C(x_i) \end{bmatrix}$$

$$\vec{k}_A(x_i) = \frac{\vec{V}_{s_A}(x_i)}{\vec{V}_{m_A}(x_i)}$$

$$\vec{k}_B(x_i) = \frac{\vec{V}_{s_B}(x_i)}{\vec{V}_{m_B}(x_i)}$$

$$\vec{k}_C(x_i) = \frac{\vec{V}_{s_C}(x_i)}{\vec{V}_{m_C}(x_i)}$$

The vectors $Vs(x_i)$ and $Vm(x_i)$ correspond to the simulated and measured three-phase voltage phasors of the voltage before the fault for the measurement location $M_i$ and from which the correction $k(x_i)$ used in the calibration and the resynchronization of the fault voltage phasors is derived. Thus, the corrected three-phase fault phasor $Vdc(x_i)$ is obtained by the multiplication of $k(x_i)$ with the measured three-phase fault voltage phasor $Vdm(x_i)$.

In summary, the technique used for the correction consists in relating the measurements with respect to the electrical line model which includes the impedance and the load estimated based on the information available in the inventory of the network. The adjustment factors of the voltage level and the phase angle between the model and the measurements before the fault, i.e.: $k(x_1)$, $k(x_2)$ et $k(x_3)$, are calculated for the measurement locations $M_1$, $M_2$, and $M_3$. These same factors are applied for the correction of the voltage phasors measured during the fault to allow their uses with the voltage drop, fault current and fault location formulae.

An improvement to the technique is possible by tuning the voltage waveforms before the fault to adjust the fault start indices such as calculated by formula (5). The following technique is given as an example.

As the voltage phasors used for the synchronization and the calibration are calculated from the fault start indices previously calculated, an error in the calculation of the phase may occur. The amplitude of this error is contained in the factors $k(x_1)$, $k(x_2)$ and $k(x_3)$ and can be used to correct the fault start indices. This correction corresponds in fact to the precise tuning of the voltage waveforms before the fault coming from the different measurement locations. It takes into account the phase shift produced by the load current on the line and also eliminates the effect of the propagation delay of the electrical signals.

The tuning of the waveforms is carried out by an adjustment of the start indices obtained with respect to the beginning of the fault using the adjustment factors previously obtained. The following formulae are used for this purpose. It must be first determined which signals are well synchronized by achieving the following tests. These tests are preferably made in the order presented in Table V.

TABLE V

| Tests | Correction angle |
|---|---|
| IF $\|\theta_1 - \theta_2\| < 0.1$ rad AND $\|\theta_1 - \theta_3\| < 0.1$ rad | $moy\theta = (\theta_1 + \theta_2 + \theta_3)/3$ |
| IF $\|\theta_1 - \theta_2\| < 0.1$ rad AND $\|\theta_1 - \theta_3\| \geq 0.1$ rad | $moy\theta = (\theta_1 + \theta_2)/2$ |
| IF $\|\theta_1 - \theta_3\| < 0.1$ rad | $moy\theta = (\theta_1 + \theta_3)/2$ |
| IF $\|\theta_2 - \theta_3\| < 0.1$ rad | $moy\theta = (\theta_2 + \theta_3)/2$ |
| Otherwise | $moy\theta = (\theta_1 + \theta_2 + \theta_3)/3$ |

The angles used are obtained from the correction factors calculated as described hereinabove, for the three measurements:

$$\theta_1 = \angle \vec{k}_A(x_1)$$

$$\theta_2 = \angle \vec{k}_A(x_2)$$

$$\theta_3 = \angle \vec{k}_A(x_3)$$

It is also possible to use the difference between these angles to validate that the measurements come from the same perturbation.

The fault start indices isynch, as previously determined, are corrected as follows:

$$isynch(x_1) = isynch(x_1) + nptscycle_1 \times (\theta_1 - moy\theta)/2\pi$$

$$isynch(x_2) = isynch(x_2) + nptscycle_2 \times (\theta_2 - moy\theta)/2\pi$$

$$isynch(x_3) = isynch(x_3) + nptscycle_3 \times (\theta_3 - moy\theta)/2\pi \quad (23)$$

The values of $nptscycle_{1,2,3}$ correspond to the number of points per cycle of the fundamental frequency that the signals sampled by the devices at the measurement locations 1, 2, 3 contain.

The previous steps which consist in obtaining new adjustment factors ($k(x_1)$, $k(x_2)$ and $k(x_3)$), retuning the signals and recalculating new fault start indices, can be repeated as long as there is a change in one of the fault start indices.

The duration of the fault is used to determine if the analysis of the fault location is possible on the measured signals. A fault duration of at least one cycle is preferable. The fault duration may also be used to insure that two voltage variation measurements coming from different locations really come from the same perturbation or event. The fault duration may also be used to determine the calculation limits of the fault distance profiles that are evaluated hereinafter. It is also possible to verify that the voltage measurements come from the same perturbation as a function of other criteria such as the phase angle of the voltage phasors at the beginning of the fault, the fault type, and the waveform during the fault.

To evaluate the duration of a fault, a distinction between the voltage loss that may follow a fault and the fault itself is made. A fault causes a voltage drop, which is followed by a return of the voltage or by a complete loss of the voltage.

If the measurement location is situated downstream from the protection device that opens, there is a voltage loss. If it is situated upstream from the protection device, there is a return of the voltage. The fault duration used to evaluate the calculation limits of the fault distance profiles corresponds to the interval between the firing of the fault current and the time where this current disappears, erased by the network protection.

In a simple way, the considered duration of the fault corresponds to the duration of the first voltage drop. The beginning of the fault is identified by the fault start index as previously calculated. The end of the fault corresponds to the time where there is a total loss of voltage or a return of the voltage depending on the case. The duration of the fault may be derived from the difference between the beginning and the end of the fault.

The fault location method comprises certain variations of calculations depending on the position of the fault with respect to the measurements used. These variations are described hereinafter.

Figure 10:
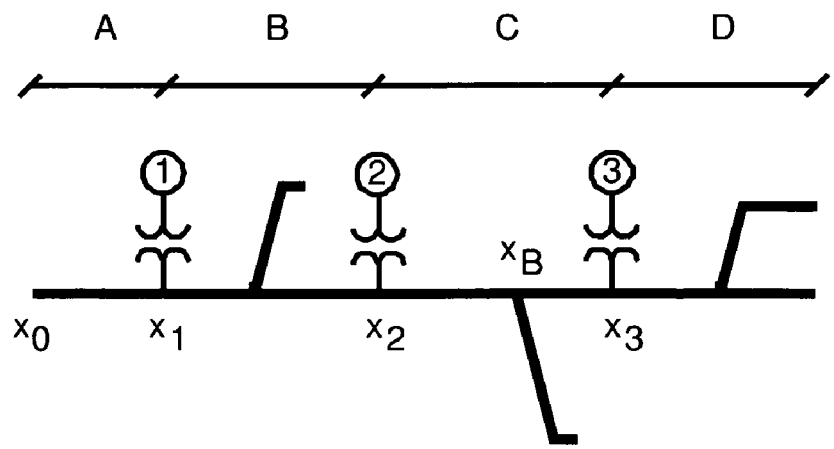
FIG. 10 is a diagram showing four possible zones of fault location with respect to the measurements on an analysis line section.

Referring to FIG. 10, the three measurement points separate the line (main line section) in four zones named as follows: A, B, C and D. The fault may occur in each one of those zones. Zone A corresponds to positions situated upstream from all the measurements. Zone B includes any line portions situated between the two first measurements including the branches. Zone C includes any line portions situated between the measurements 2 and 3 including the branches. Zone D corresponds to any portions of the network situated downstream from the last measurement.

The process for determining the zone uses voltage phasors in fault condition calculated and ordered as described hereinabove. The dynamic configuration of the network and eventual reversals of the source are preferably also considered. The nature of the fault as determined hereinabove is considered so that for a φ-n fault, the φ-n phasors are used, whereas for a φ-φ fault, the phasor resulting from the two faulty phases is used. The calibration and synchronization factors obtained hereinabove are applied to the phasors.

To determine the zone of the fault, certain conditions may be verified. For a fault situated in zone A, the fault voltage phasors of the three measurement locations are identical. The phasors are considered to be identical if the difference of their absolute amplitudes is below 5% or another predefined threshold if desired. For a fault situated in zone B, the phasors 2 and 3 are identical and their phase angle as well as their modulus are smaller than those of the phasor 1. For a fault situated in zones C and D, the three measurements are different. In that case, the fault current is evaluated by formula (1) using the measurements 1 and 2. The result is used in formula (2) which is evaluated for the position of the third measurement ($x=x_3$). If the obtained voltage is identical (e.g. within 5%) to that of the third measurement, then the fault is situated in zone D. If it is smaller, the fault is in zone C.

The four parameters characterizing a fault according to the method described here are: $x_B$, $x_D$, $I_d$ and $V_d$. The evaluation of these parameters may be achieved by using a sampling window equivalent to a cycle considering a use of a discrete Fourier transform.

The voltage phasors of each one of the measurements in fault condition are evaluated according to the calculations of phasors described hereinabove. The phasors obtained at each position are calibrated and synchronized according to the factors obtained hereinabove. Depending on the fault type previously found and the zone identified for the fault, $x_B$, $x_D$, $I_d$ and $V_d$ are evaluated. The particulars specific to each zone are explained hereinafter.

It should be noted that depending on the position of the fault and the disposals of the measurements, the method may identify several possible locations. For each possible location, the parameters characterizing the fault are evaluated.

The location of the faulty branch depends on the position of the fault with respect to the location of the measurements as identified in the determination of the zone of the fault.

For a fault situated in zone A, the fault cannot be located and it may be concluded that the fault is located upstream from all the measurement locations. If one of the measurement locations used is located at the source (station), it may be concluded that the fault comes either from the transmission network, or from another line connected to the source.

In the case of zone B, only one measurement upstream from the fault is available to evaluate the current. It is possible to solve this case by using the information on the impedance of the station including the impedance of the transmission transformer (this information is not required in the case of zone C and D). The result of the calculation is less precise and depends on the accuracy of the estimation of that impedance. However, since zone B is likely to cover a shorter distance than for zones C and D, the final location, in terms of range (distance between two poles), remains quite acceptable.

A technical stratagem resides in the two following facts. First, the magnitude of the voltage at the station (voltage of the source) is estimated by the voltage measured before the fault by the first measurement ($|\vec{V}(x_1)|=|\vec{V}p|$). Then, the voltage phasor at the beginning point of the faulty branch may be estimated by one of the measurements situated downstream from that point. In the first case, it is assumed that the usual load current does not cause a significant voltage drop (the voltage phase shift could be important, but it is not used here). Certain improvements of this estimation are possible by applying the load profile. In the second case, it is considered that during the fault, the current that flows in the set of loads downstream is insignificant, or even nil, with respect to the fault current.

These two facts lead to the following formulae:

$$\vec{I}d_0(x) = \frac{(\vec{V}d_0(x_1) - \vec{V}d_0(x_2))}{(\vec{Z}th_0(x) - \vec{Z}th_0(x_1))} \quad (24)$$

$$\vec{I}d_+(x) = \frac{(\vec{V}d_+(x_1) - \vec{V}d_+(x_2))}{(\vec{Z}th_+(x_2) - \vec{Z}th_+(x_1))}$$

$$\vec{I}d_-(x) = \frac{(\vec{V}d_-(x_1) - \vec{V}d_-(x_2))}{(\vec{Z}th_-(x) - \vec{Z}th_-(x_1))}$$

$$\vec{V}p_0 = \vec{V}d_0(x_1) + \vec{I}d_0(x) \times \vec{Z}th_0(x_1) \quad (25)$$
$$\vec{V}p_+ = \vec{V}d_+(x_1) + \vec{I}d_+(x) \times \vec{Z}th_+(x_1)$$
$$\vec{V}p_- = \vec{V}d_-(x_1) + \vec{I}d_-(x) \times \vec{Z}th_-(x_1)$$

Formula (24) evaluates the fault current that would flow in the line if the fault (or faulty branch) would be at the position x comprised between $x_1$ and $x_2$.

By combining these formulae, the following equations are found:

$$\vec{V}p_0 = \vec{V}d_0(x_1) + \frac{(\vec{V}d_0(x_1) - \vec{V}d_0(x_2)) \times \vec{Z}th_0(x_1)}{\vec{Z}th_0(x) - \vec{Z}th_0(x_1)} \quad (26)$$

$$\vec{V}p_+ = \vec{V}d_+(x_1) + \frac{(\vec{V}d_+(x_1) - \vec{V}d_+(x_2)) \times \vec{Z}th_+(x_1)}{\vec{Z}th_+(x) - \vec{Z}th_+(x_1)}$$

$$\vec{V}p_- = \vec{V}d_-(x_1) = \frac{(\vec{V}d_-(x_1) - \vec{V}d_-(x_2)) \times \vec{Z}th_-(x_1)}{\vec{Z}th_-(x) - \vec{Z}th_-(x_1)}$$

The following equality derived from the global RMS voltage of the three-phase signal is then set:

$$|\vec{V}p_0|^2 + |\vec{V}p_+|^2|\vec{V}p_-|^2 = |\vec{V}_0(x_1)|^2 + |\vec{V}_+(x_1)|^2 + |\vec{V}_-(x_1)|^2 \quad (27)$$

This equation has a unique solution, i.e. $x=x_B$, which corresponds to the position of the fault or of the faulty branch, depending on the case. The fault voltage at this location is considered as equal to the fault voltage of the second measurement, i.e.: $\vec{V}d(x_B)=\vec{V}d(x_2)$ In the case of zone C, the fault current is determined by the evaluation of formula (1) using the two first measurements:

$$\vec{I}d_0(x_1, x_2) = \frac{(\vec{V}d_0(x_1) - \vec{V}d_0(x_2))}{(\vec{Z}th_0(x_2) - \vec{Z}th_0(x_1))} \quad (28)$$

$$\vec{I}d_+(x_1, x_2) = \frac{(\vec{V}d_+(x_1) - \vec{V}d_+(x_2))}{(\vec{Z}th_+(x_2) - \vec{Z}th_+(x_1))}$$

$$\vec{I}d_-(x_1, x_2) = \frac{(\vec{V}d_-(x_1) - \vec{V}d_-(x_2))}{(\vec{Z}th_-(x_2) - \vec{Z}th_-(x_1))}$$

In order to calculate the distance of the faulty branch, a value of x is found so that formula (1) evaluated for the distances of x and $x_1$ as well as with the voltage phasors $Vd(x_1)$ and $Vd(x_3)$ produces a fault current phasor whose modulus is equal to that previously evaluated:

$$\vec{I}d_0(x_1, x) = \frac{(\vec{V}d_0(x_1) - \vec{V}d_0(x_3))}{(\vec{Z}th_0(x) - \vec{Z}th_0(x_1))} \quad (29)$$

$$\vec{I}d_+(x_1, x) = \frac{(\vec{V}d_+(x_1) - \vec{V}d_+(x_3))}{(\vec{Z}th_+(x) - \vec{Z}th_+(x_1))}$$

$$\vec{I}d_-(x_1, x) = \frac{(\vec{V}d_-(x_1) - \vec{V}d_-(x_3))}{(\vec{Z}th_-(x) - \vec{Z}th_-(x_1))}$$

The following formula is used to determine the value of x that provides an equality in the voltage phasor moduli as evaluated with formulae (28) and (29):

$$|\vec{I}d_0(x_1,x_2)|^2 + |\vec{I}d_+(x_1,x_2)|^2 = |\vec{I}d_-(x_1,x_2)|^2 =$$
$$|\vec{I}d_0(x_1,x_2)|^2 + |\vec{I}d_+(x_1,x_2)|^2 = |\vec{I}d_-(x_1,x_2)|^2 \quad (30)$$

The distance so determined is equal to the distance from the faulty branch $x_B=x$ and the fault voltage evaluated at the position of the branch will be equal to that of the third measurement i.e.: $\vec{V}d(x_B)=\vec{V}d(x_3)$.

For zone D, the position of the faulty branch will be considered as equal to $x_3$ and the fault voltage at this location will be equal to that of the third measurement i.e.: $\vec{V}d(x_B)=\vec{V}d(x_3)$.

The position of the branch $x_B$ where the fault is located being determined depending on a zone B or C or D, all the branches situated near this position on the analysis line section are identified for the continuation of the analysis. A variation of ±2% on the position of $x_B$ is proposed as an example to determine an interval in which all the branches will be considered for the continuation of the location calculation of the fault.

If no branches are located on the main line section within the determined interval, the fault will be considered as being on the main line section. The fault position $x_D$ will be equal to $x_B$ and the fault voltage will be equal to the modulus of the fault voltage evaluated at the position $x_B$ i.e.: $Vd=|\vec{V}d(x_B)|$ and this depending on the fault type as determined by Table IV using the corresponding fault phasor as identified by Table II.

The fault current is evaluated by:

$$\vec{I}d_0 = \frac{(\vec{V}d_0(x_1) - \vec{V}d_0(x_B))}{(\vec{Z}th_0(x_B) - \vec{Z}th_0(x_1))} \quad (31)$$

$$\vec{I}d_+ = \frac{(\vec{V}d_+(x_1) - \vec{V}d_-(x_B))}{(\vec{Z}th_+(x_B) - \vec{Z}th_+(x_1))}$$

$$\vec{I}d_- = \frac{(\vec{V}d_-(x_1) - \vec{V}d_-(x_B))}{(\vec{Z}th_-(x_B) - \vec{Z}th_-(x_1))}$$

The three-phase phasor Id may be re-evaluated with $x_B$ according to formula (31) or with the distances corresponding to the beginning positions of each branch identified in the zone surrounding the position $x_B$ on the analysis line section.

The load current during the fault adds an angular phase shift to the voltage phasors as well as a decrease of their amplitudes. FIG. 18 shows these variations on the voltage phasors of the faulty phase.

Knowing the three-phase fault current phasor Id, as well as the position of the branch ($x_B$), the correction technique of the phasors due to the load current during the fault described hereinbelow may be used to eliminate the influence of the load current during the fault on the measured voltage phasors.

Two simulations may be carried out to eliminate the contribution of the load current to the voltage phasors. The line model previously described may be used. The purpose of these two simulations is to recreate the diagram of FIG. 18 and to find the amplitude ratios and the differences of the angles of the phasors. These ratios and differences will be used to correct the phasors measured during the fault. A first simulation is carried out to obtain the voltage phasors by using the load current and the fault current in the model. A series of three-phase voltage phasors $Vsdc(x_1) \ldots Vsdc(x_n)$ corresponding to the location of the measurements for which corrections are desired is obtained. A second simulation is carried out, but taking into account only the fault current. A second series of three-phase voltage phasors $Vsd(x_1) \ldots Vsd(x_n)$ is obtained.

The formulae used to consider the contribution of the load current may be similar to those explained in respect with the calibration and the resynchronization.

The correction of the voltage phasors is given by the following formulae:

$$Vd(x_i) = kc(x_i) \times Vdc(x_i) \quad (35)$$

$$Vd(x_i) = \begin{bmatrix} \vec{V}d_A(x_i) \\ \vec{V}d_B(x_i) \\ \vec{V}d_C(x_i) \end{bmatrix}$$

$$Vdc(x_i) = \begin{bmatrix} \vec{Vdc}_A(x_i) \\ \vec{Vdc}_B(x_i) \\ \vec{Vdc}_C(x_i) \end{bmatrix}$$

$$kc(x_i) = \begin{bmatrix} \vec{kc}_A(x_i) & \vec{kc}_B(x_i) & \vec{kc}_C(x_i) \end{bmatrix}$$

$$\vec{kc}_A(x_i) = \frac{\vec{V}sd_A(x_i)}{\vec{V}sdc_A(x_i)}$$

$$\vec{kc}_B(x_i) = \frac{\vec{V}sd_B(x_i)}{\vec{V}sdc_B(x_i)}$$

$$\vec{kc}_C(x_i) = \frac{\vec{V}sd_C(x_i)}{\vec{V}sdc_C(x_i)}$$

The phasors $Vdc(x_i)$ correspond to the three-phase voltage phasors at the time of the fault which may have been corrected beforehand by the resynchronization and calibration technique explained hereinabove. The three-phase voltage phasors $Vd(x_i)$ correspond to the same voltage phasors whose load contribution has been eliminated.

The three-phase fault current Id may be calculated again by formula (31) while taking into account the corrections obtained by formulae (35).

A rotation of the voltage and current phasors is carried out so that the phase angle of $\vec{I}d$ be nil (see formula (3)). The amplitude of the fault current may now be set as the modulus of the current used for the rotation of the phasors (see Table I—Rotation phase angle depending on the fault type).

The fault location continues using formula (2) with the following values:

$$\vec{V}d_0(x) = \vec{V}d_0(x_B) - \vec{I}d_0 \times (\vec{Z}th_0(x) - \vec{Z}th_0(x_B))$$

$$\vec{V}d_+(x) = \vec{V}d_+(x_B) - \vec{I}d_+ \times (\vec{Z}th_+(x) - \vec{Z}th_+(x_B))$$

$$\vec{V}d_-(x) = \vec{V}d_-(x_B) - \vec{I}d_- \times (\vec{Z}th_-(x) - \vec{Z}th_-(x_B)) \quad (36)$$

All the branch and sub-branch possibilities should be considered in the evaluation. As the voltage is in phase with the current at the fault location, the distances meeting the condition $\angle \vec{V}d(x)=0$ will be considered as possible locations of the fault ($x_D = x$) and the moduli of the resulting phasors indicate the fault voltage at each one of these locations ($Vd = |\vec{V}d(x)|$). It should be noted that the phasor $\vec{V}d(x)$ is evaluated differently depending on the fault type (for the details, see Table II—Fault voltage depending on the fault type).

If the value of $x_D$ is equal to $x_B$, then the fault is situated on the main line section delimited by the locations of the three measurements.

In most of the cases, the duration of the fault exceeds the period of one cycle used for the analysis. It is then possible to produce several analysis results that will be used to create time profiles for each parameter characterizing the fault.

The parameters are calculated according to the fault evaluation technique described hereinabove for each analysis position comprised between the index found in respect with the beginning of the fault and the end of the fault as determined in the calculation of the fault duration, minus the duration of the fundamental frequency cycle. Each value is kept to produce the profiles that will be analysed afterwards.

Figure 11:
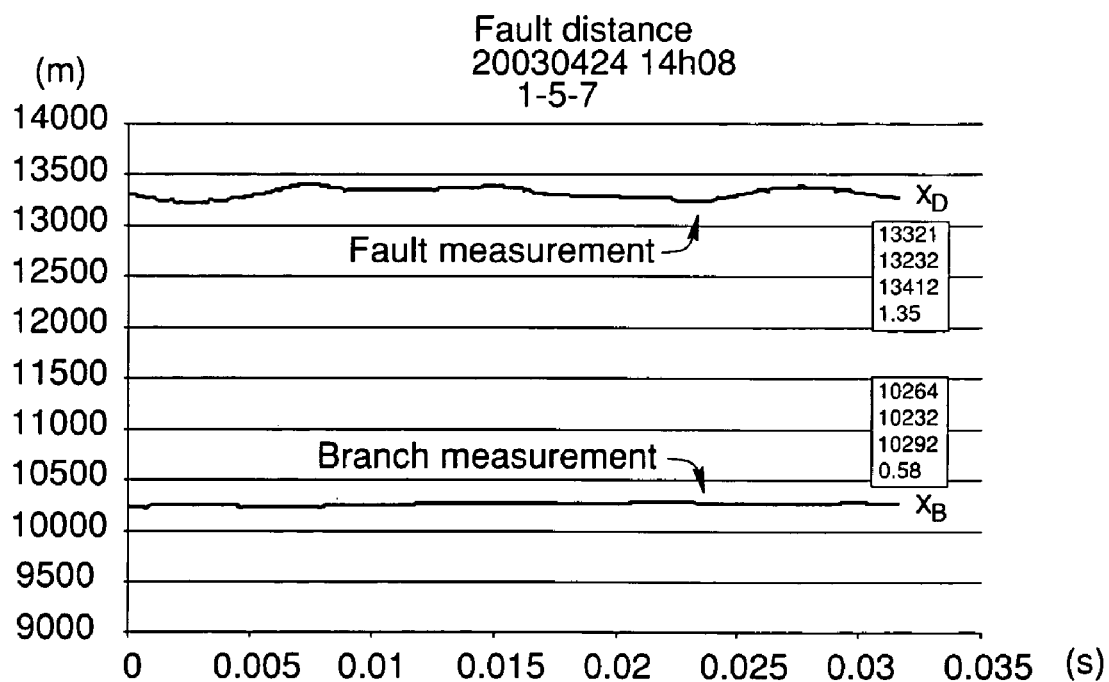
FIG. 11 is a graph illustrating distances of the fault and of a corresponding branch of the electrical network as a function of a given analysis window on a voltage oscillogram.

FIG. 11 shows a distance measurement profile example. The two location parameters $x_B$, $x_D$ are invariable for a fault. The variations seen in these profiles thus express the evolution of the measurement error combined with the calculation error and not the real changes. These profiles have at least two uses. First, they allow improving the evaluation of the location. The mean of all the obtained values allow obtaining a more precise result, less sensible to measurement errors. Second, they may come to help in determining the fault duration, i.e. the period to use for calculating the mean. To determine this period, the results of the calculation of the distance of the faulty branch may be used, as they are stable as shown in FIG. 11. What FIG. 11 does not show is that the curve of the branch distance may be subjected to strong variations exceeding the limits of the graph. In FIG. 11, the start and end calculation limits have been incidentally set as a result of this observation.

Figure 12:
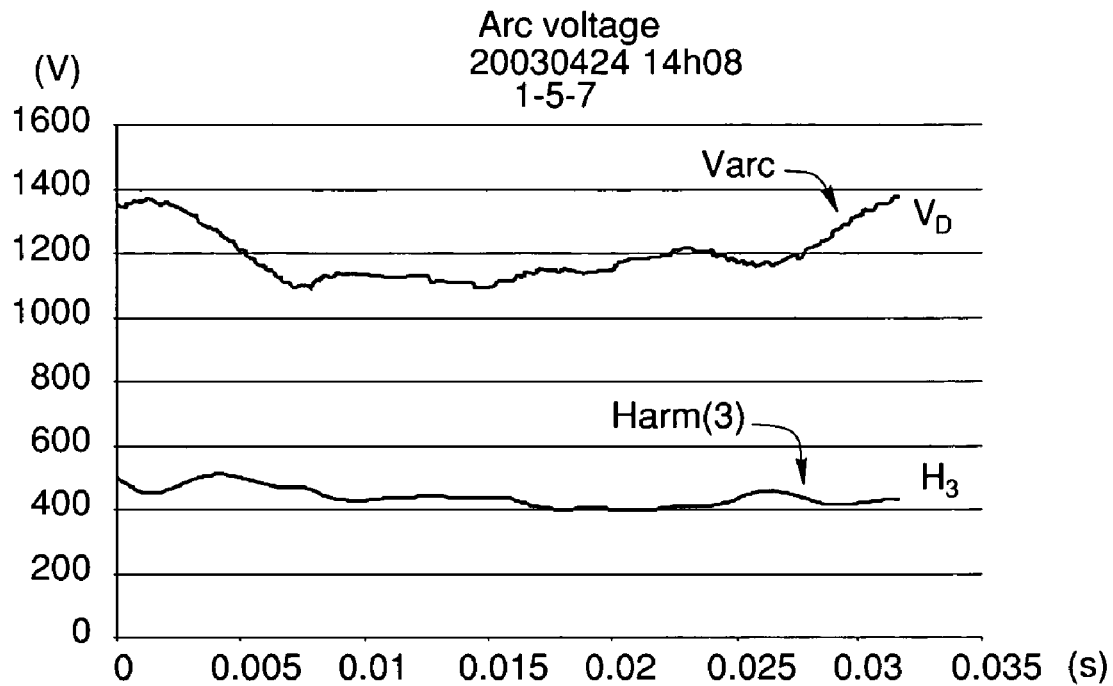
FIG. 12 is a graph illustrating a fundamental amplitude of the voltage during the fault and its third harmonic according to a given analysis window on a voltage oscillogram.
Figure 13:
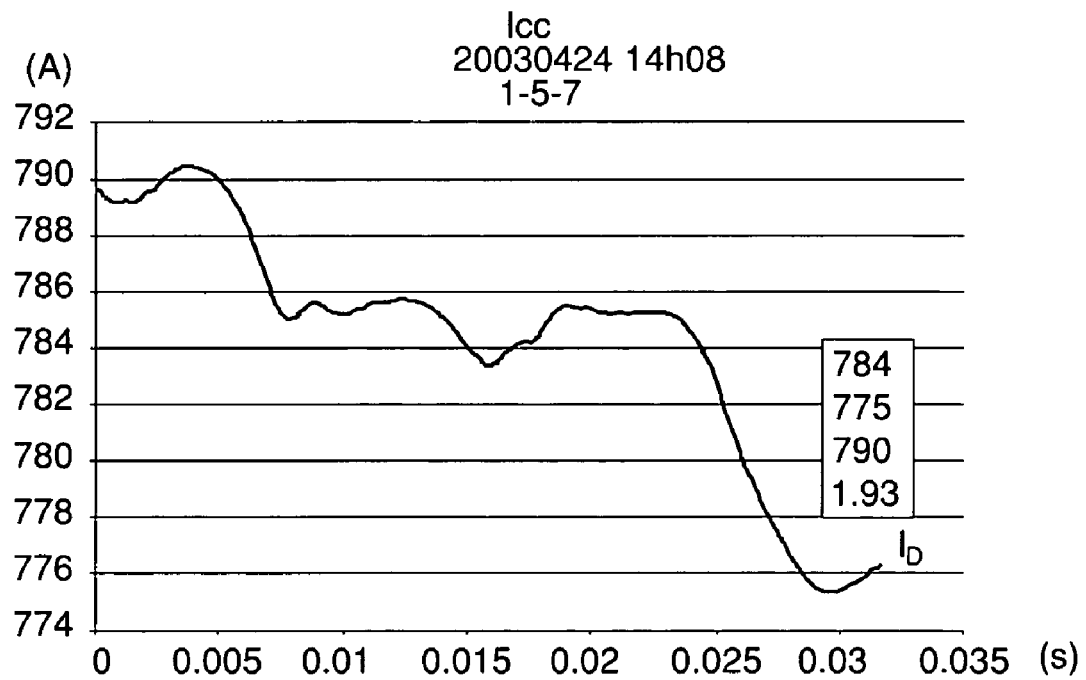
FIG. 13 is a graph illustrating a fault current according to a given analysis window on a voltage oscillogram.

FIGS. 12 and 13 show fault voltage and current profiles calculated on the same previously determined period. These curves are useful to determine the nature and the cause of the fault. This may allow detailing the type of equipment to be monitored when a patrol is asked for. For example, a nil arc voltage probably indicates that a broken conductor fell on another one. Likewise, the opening arc voltage profile of a transformer fuse is recognizable according to the obtained results. Contacts of the vegetation between the phase and the neutral or between the phases are detectable by the development of a proportional arc voltage in a ratio of 1 kV per meter of clearance (or arc elongation) in the air. The voltage graph of FIG. 12 corresponds to a case of contact of the vegetation with a single phase conductor having a clearance of approximately 130 cm.

The voltage arc situated at the location of the fault is not considered as a resistance by the method. It has a nil impedance with a variable source voltage. Its model is equivalent to a Zener diode and the location method allows evaluating its amplitude.

When the arc voltage developed at the location of the fault is calculated, it is possible to derive the distance between the conductors or between the phase and the neutral point at the location of the fault. In the case of a tree branch, a voltage of 1.5 kV to 2 kV could be measured, which corresponds to 1.5 m to 2 m if the conductors are not moved by the branch. The arc voltage so measured allows deriving in a large number of cases the cause of the fault. The following Table VI shows an example of characterization of the nature of the fault by pairing the results with a measurement of the local weather.

TABLE VI

| | |
|---|---|
| Measured fault voltage (kV): | 0-0.5 |
| Fault type (3 phases, phase-phase, phase-neutral): | Phase-phase |
| Repetition of the fault in a close time interval: | no |
| Gust (km/h): | 60 |
| Temperature (Celsius): | N/A |
| Type of precipitation (snow, rain, black ice): | N/A |
| Amount of precipitation (mm): | N/A |
| Fault type: | Galloping between the phases |

An analysis of the fault current profiles shows that the precision on the location is better for the high fault current values. This observation may be used in certain cases to help choosing the most appropriate profiles for evaluating the distance of the fault.

The calculation of the parameters of the fault may be based on the mean of the values contained in the profiles to which 50% of the values whose fault branch positions (XB) correspond to maximum and minimum values have been eliminated.

The arrangement of the measuring points on a distribution network for the application of the method may be simplified by using the measurement points at the low voltage clients, as previously indicated. Such locations are generally advantageous in view of the availability of the voltage, the current and the communication infrastructure. The wave quality measurement on the distribution networks and even more on the transmission one is more and more available and accessible, which renders the method easy of application.

The use of voltage phasors allows significantly reducing the number of measurement locations. The proposed method fulfils the needs of precise synchronization and calibration of the measurements by pairing real and simulated measurements, which allows using simple and low cost measurements.

The triangulation of the voltage measurements during the fault allows a significant reduction of the calculated number of probable locations compared to the known techniques using current and voltage measurements taken at a distribution station. In certain conditions, the triangulation identifies the zone of the fault as the fault indicators installed on the mid-voltage side do. Some of these apparatuses could then be removed from the network, which constitutes a gain considering their maintenance costs.

The location of the first branch level that derives from the axis formed by the measurement locations towards the fault is used to identify the discrepancies in the line topology database. Thus, a fault measured on phase A that would be located on a branch identified as a single phase B would indicate an error in the database containing the line configuration.

The location of the first branch level also allows resetting the cumulative error on the calculation of the distance of the fault situated between the first measurement and the branch. The cumulative error is produced by the inaccuracy of the impedance of the conductors and the length of the conductors, as well as by the measurement errors. For a branch located at the middle of the distance of the fault, the resetting of the cumulative error doubles the accuracy on the location of the fault if the first measurement is situated close to the station.

The calibration and synchronization technique of the signals produces precise voltage phasors from the measurements whose absolute amplitude is not precise, which allows using simpler and easier to access measurements situated on the low voltage side. For example, the use of the method is contemplated to obtain voltage phasors on a transmission network from voltage measurements taken on capacitive dividers.

The use of distributed voltage measurements, essentially consisting of electrical meters having wave quality measurement capacities, is an advantage for some electrical distributors who want locating network faults, but who have no access to the distribution station belonging to the energy carrier. Also, the automation of the electrical networks involves the installation of a multitude of equipments, essentially of controllers having wave quality measurement capabilities making the voltage variation recordation as well as a communication infrastructure available. The voltage measurements may come from any wave quality measurement device disposed on the electrical network, capable of detecting voltage drops and recording and communicating the voltage measurements.

When voltage measurements at more than three measurement locations on the electrical network are available, the method may advantageously analyze the measurements in order to select a trio of measurements providing the best location result. For this purpose, trios are formed from different combinations of voltage phasors corresponding to the voltages measured during the fault. The evaluation of the fault position on the electrical network is then achieved for all the trios. The trio providing a better location precision among all the trios is then selected, the fault being then located with respect to the position of the fault and the corrected voltage phasors during the fault associated to the selected trio.

While embodiments of the invention have been illustrated in the accompanying drawings and described above, it will be evident to those skilled in the art that modifications may be made therein without departing from the invention.

The invention claimed is:

1. A method for locating a fault on an electrical network energized by a source, the method comprising the steps of:
   measuring voltages at three or more different measurement locations on the electrical network;
   determining voltage phasors corresponding to the voltages measured during the fault, the voltage phasors being time synchronized;
   evaluating a fault current as a function of the voltage phasors at two of the measurement locations situated upstream from the fault and an impedance of the electrical network between the two of the measurement locations; and
   evaluating a position of the fault on the electrical network corresponding to a point of the electrical network where the following intersect with each other:
      (i) a voltage drop phasor defined as a function of: the fault current, an impedance between the point of the electrical network and one of the two measurement locations, and the voltage phasor at one of the two measurement locations; and
      (ii) a reference axis coinciding with a phasor corresponding to the fault current.

2. The method according to claim 1, further comprising the step of detecting voltage drops at the measurement locations, the voltages being measured when the voltage drops are detected.

3. The method according to claim 1, wherein one of the measurement locations is situated on the electrical network so as to provide voltage measurements equivalent to the voltage on a line section of the electrical network situated past the fault.

4. The method according to claim 1, wherein the voltages measured at one or more of the measurement locations are taken on secondaries of transformers of the electrical network.

5. The method according to claim 1, wherein the voltage phasors during the fault are synchronized as a function of voltage phasors corresponding to the voltages measured before the fault and corresponding voltage phasors simulated according to a model representing the electrical network and including impedance and load estimations according to a flowing path of the fault current on the electrical network.

6. The method according to claim 5, wherein the step of determining the voltage phasors during the fault comprises the sub-steps of:
   determining voltage level and phase angle adjustment factors between the voltage phasors corresponding to the voltages measured during the fault and corresponding simulated voltage phasors;
   applying the adjustment factors to the voltage phasors corresponding to the voltages measured during the fault; and
   synchronizing the voltage phasors to which the adjustment factors have been applied.

7. The method according to claim 1, further comprising, prior to the step of determining the voltage phasors during the fault, the step of:
   ordering the voltage measurements according to a succession of the measurement locations along a flow path of the fault current on the electrical network beginning from the source, as a function of ratios between voltage phasors moduli corresponding to the voltages measured before and during the fault.

8. The method according to claim 7, further comprising the step of:
   forming trios from different combinations of the voltage phasors corresponding to the voltages measured during the fault, the step of evaluating the position of the fault on the electrical network being carried out for all the trios.

9. The method according to claim 8, wherein the step of evaluating the position of the fault comprises the step of selecting one of the trios providing a best location precision among all the trios, the position of the fault being evaluated according to the voltage measurements at the measurement locations associated to the selected trio.

10. The method according to claim 1, wherein the measured voltages come from wave quality measuring devices disposed on the electrical network, capable of detecting voltage drops and recording and communicating voltage measurements.

11. The method according to claim 1, further comprising the step of:
   re-evaluating the fault current and the position of the fault depending on whether the electrical network comprises branches between the source and the position of the fault initially evaluated, as a function of predetermined characteristics related to the branches involved between the source and the position of the fault initially evaluated.

12. The method according to claim 11, wherein the predetermined characteristics related to the branches involved comprise distances of the branches with respect to the source and impedances of equipments situated at the branches.

13. The method according to claim 1, further comprising the step of:
   determining a voltage amplitude of the fault at the position of the fault as a function of an amplitude defined between an origin of the reference axis and an intersection of the voltage drop phasor with the reference axis.

14. The method according to claim 1, wherein the evaluated position corresponds to an intersection between a flowing path of the fault current on the electrical network and a branch of the electrical network where one of the measurement locations is situated when the voltage drop phasor and a reference axis coinciding with the voltage phasor at the one of the measurement locations intersect with each other.

15. The method according to claim 1, further comprising the step of:
   correcting the voltage phasors during the fault according to characteristics of the electrical network applicable at the evaluated position of the fault on the electrical network to compensate effects caused by load currents during the fault.

16. A method for locating a fault on an electrical network energized by a source, the method comprising the steps of:
   measuring voltages at three or more different measurement locations on the electrical network, at least one of the measurement locations being situated between the source and the fault;
   determining voltage phasors corresponding to the voltages measured during the fault, the voltage phasors being time synchronized;
   determining conductors of the electrical network involved in the fault as a function of characteristics of the voltage phasors corresponding to the voltages measured during the fault at one of the measurement locations;
   evaluating a fault current causing a voltage drop at one or more of the measurement locations with respect to an initial voltage value at said one or more of the measurement locations; and evaluating a position of the fault on the electrical network corresponding to a point of the electrical network where a ratio between:
  i) a difference of the voltages measured during the fault at two of the measurement locations, and
  ii) an impedance between one of the two measurement locations and said point of the electrical network, depending on the conductors involved in the fault, is equal to the fault current,
wherein the voltage phasors during the fault are synchronized as a function of voltage phasors corresponding to the voltages measured before the fault and corresponding voltage phasors simulated according to a model representing the electrical network and including impedance and load estimations according to a flowing path of the fault current on the electrical network, and wherein the step of determining the voltage phasors during the fault comprises the sub-steps of:
  determining voltage level and phase angle adjustment factors between the voltage phasors corresponding to the voltages measured during the fault and corresponding simulated voltage phasors;
  applying the adjustment factors to the voltage phasors corresponding to the voltages measured during the fault; and
  synchronizing the voltage phasors to which the adjustment factors have been applied.

17. The method according to claim 16, further comprising the step of:
  verifying that the voltage measurements come from a same perturbation as a function of at least one criterion comprising a duration of the fault, a phase angle of the voltage phasors at the beginning of the fault, a fault type, and a waveform during the fault.

18. A method for locating a fault on an electrical network energized by a source, the method comprising the steps of:
  measuring voltages at three or more different measurement locations on the electrical network, at least one of the measurement locations being situated between the source and the fault;
  determining voltage phasors corresponding to the voltages measured during the fault, the voltage phasors being time synchronized;
  determining conductors of the electrical network involved in the fault as a function of characteristics of the voltage phasors corresponding to the voltages measured during the fault at one of the measurement locations;
  evaluating a fault current causing a voltage drop at one or more of the measurement locations with respect to an initial voltage value at said one or more of the measurement locations; and
  evaluating a position of the fault on the electrical network corresponding to a point of the electrical network where a ratio between:
    i) a difference of the voltages measured during the fault at two of the measurement locations, and
    ii) an impedance between one of the two measurement locations and said point of the electrical network, depending on the conductors involved in the fault, is equal to the fault current; and
  correcting the voltage phasors during the fault according to characteristics of the electrical network applicable at the evaluated position of the fault on the electrical network to compensate effects caused by load currents during the fault.

19. The method according to claim 18, wherein the step of correcting the voltage phasors during the fault comprises the sub-steps of:
  determining voltage level and phase angle adjustment factors corresponding to the effects caused by the load currents during the fault; and
  applying the voltage level and phase angle adjustment factors to the voltage phasors during the fault.

20. The method according to claim 19, wherein the adjustment factors are determined by comparing voltage phasors simulated according to a model of the electrical network while respectively including and excluding the load currents.

21. The method according to claim 18, further comprising the step of:
  re-evaluating the fault current and the position of the fault depending on whether the electrical network comprises branches between the source and the position of the fault initially evaluated, the position of the fault and the characteristics of the electrical network used for correcting the fault voltage phasors being modified as a function of the re-evaluated fault current and position of the fault.

* * * * *